(12) United States Patent
Sakui et al.

(10) Patent No.: US 11,990,204 B2
(45) Date of Patent: May 21, 2024

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 135 days.

(21) Appl. No.: 17/857,317

(22) Filed: Jul. 5, 2022

(65) Prior Publication Data

US 2023/0012075 A1 Jan. 12, 2023

(30) Foreign Application Priority Data

Jul. 6, 2021 (WO) .................. PCT/JP2021/025397

(51) Int. Cl.
*G11C 7/10* (2006.01)
*G11C 7/18* (2006.01)

(52) U.S. Cl.
CPC .............. *G11C 7/1039* (2013.01); *G11C 7/18* (2013.01)

(58) Field of Classification Search
CPC ................................ G11C 7/1039; G11C 7/18
(Continued)

(56) References Cited

U.S. PATENT DOCUMENTS 9,099,186 B2 * 8/2015 Tailliet ............... G11C 16/0433
11,456,297 B2 * 9/2022 Ahn ....................... G11C 11/404
(Continued)

FOREIGN PATENT DOCUMENTS

JP H 02-188966 A 7/1990
JP H 03-171768 A 7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).

(Continued)

*Primary Examiner* — Connie C Yoha
(74) *Attorney, Agent, or Firm* — Crowell &Moring LLP

(57) ABSTRACT

A page write operation is performed to hold positive hole groups generated by an impact ionization phenomenon, in a channel semiconductor layer of a memory cell and a page erase operation is performed to remove the positive hole groups out of the channel semiconductor layer. a refresh operation is performed to return the voltage of the channel semiconductor layer of a selected word line to a first data retention voltage thereby forming the positive hole groups by an impact ionization phenomenon in the channel semiconductor layer of the memory cell in which a voltage of the channel semiconductor layer is set to the first data retention voltage using the page write operation. The refresh operation is performed, with a switch circuit kept in a nonconducting state, concurrently with a page read operation of reading page data of a first memory cell group belonging to a first page.

6 Claims, 18 Drawing Sheets

(58) Field of Classification Search
USPC .................................................. 365/189.011
See application file for complete search history.

(56) References Cited

U.S. PATENT DOCUMENTS

| | | | |
|---|---|---|---|
| 11,776,620 B2* | 10/2023 | Sakui | G11C 11/4076 |
| | | | 365/189.011 |
| 2003/0111681 A1 | 7/2003 | Kawanaka | |
| 2004/0240273 A1* | 12/2004 | Sakui | G11C 5/025 |
| | | | 365/185.33 |
| 2006/0049444 A1 | 3/2006 | Shino | |
| 2006/0157738 A1 | 7/2006 | Kawanaka | |
| 2008/0137394 A1 | 6/2008 | Shimano et al. | |
| 2008/0212366 A1 | 9/2008 | Ohsawa | |
| 2023/0012075 A1* | 1/2023 | Sakui | G11C 7/18 |
| 2023/0186977 A1* | 6/2023 | Sakui | H10B 12/20 |
| | | | 365/189.011 |
| 2023/0397394 A1* | 12/2023 | Harada | G11C 11/4096 |

FOREIGN PATENT DOCUMENTS

| | | |
|---|---|---|
| JP | 2003-188279 A | 7/2003 |
| JP | 2006-080280 A | 3/2006 |
| JP | 2008-147514 A | 6/2006 |
| JP | 3957774 B2 | 5/2007 |
| JP | 2008-218556 A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi, "Memory design using a one-transistor gain cell on SOI", IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM 4 pgs. (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng, Y. He, G. Du, X. Liu and X. Zhang: "Experimental investigation of self heating effect (SHE) in multiple-fin SOI FinFETs", Semicond. Sci. Technol. 29 (2014) 115021, 9 pgs.

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., vol. E90-C, No. 4 pp. 765-771 (2007).

International Search Report (PCT/ISA/210) (Japanese) from PCT/JP2021/025397 dated Aug. 17, 2021, 3 pgs.

English translation of International Search Report (PCT/ISA/210) from PCT/JP2021/025397 dated Aug. 17, 2021, 2 pgs.

International Written Opinion (PCT/ISA/237) (Japanese) from PCT/JP2021/025397 dated Aug. 17, 2021, 8 pgs.

\* cited by examiner

FIG. 2A

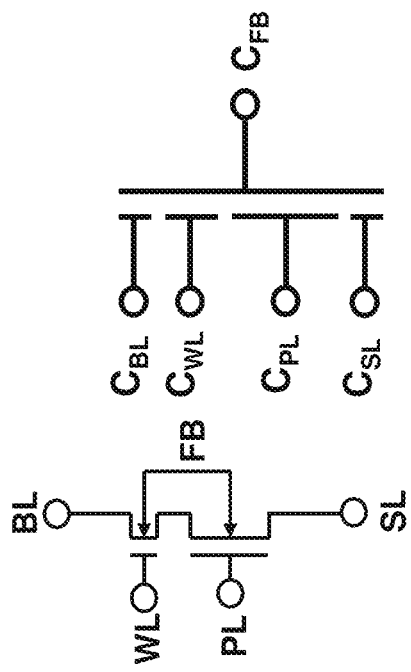

FIG. 2B

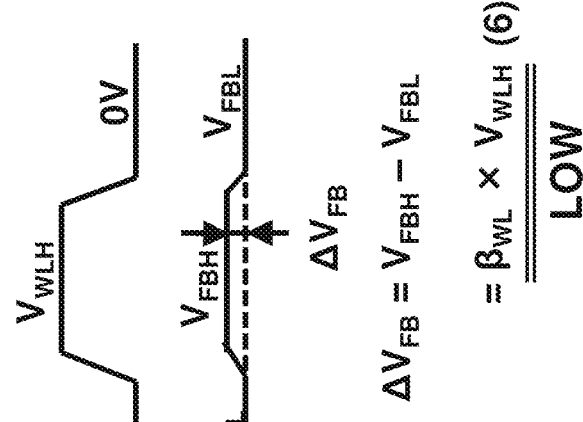

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{LOW } \beta_{WL}$$

$$\beta_{PL} = \frac{C_{PL}}{C_{WL} + C_{PL} + C_{BL} + C_{SL}} \quad (3) \Rightarrow \text{HIGH } \beta_{PL}$$

$$\beta_{BL} = \frac{C_{BL}}{C_{WL} + C_{PL} + C_{BL} + C_{SL}} \quad (4) \Rightarrow \text{LOW } \beta_{BL}$$

$$\beta_{SL} = \frac{C_{SL}}{C_{WL} + C_{PL} + C_{BL} + C_{SL}} \quad (5) \Rightarrow \text{LOW } \beta_{SL}$$

FIG. 2C

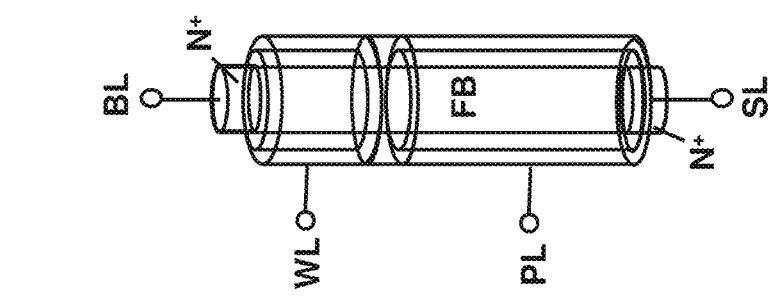

$$\Delta V_{FB} = V_{FBH} - V_{FBL}$$

$$= \underline{\beta_{WL} \times V_{WLH}} \quad (6)$$
$$\text{LOW}$$

FIG.3AB
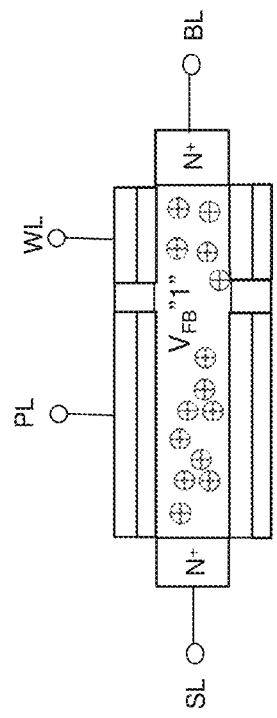
$$V_{FB}"1" = Vb - \beta_{WL} \times Vt_{WL}"1" - \beta_{BL} \times V_{BLH} \quad (7)$$
LOW
FIG.3AA "1" PAGE WRITING OPERATION
SOURCE-SIDE IMPACT IONIZATION
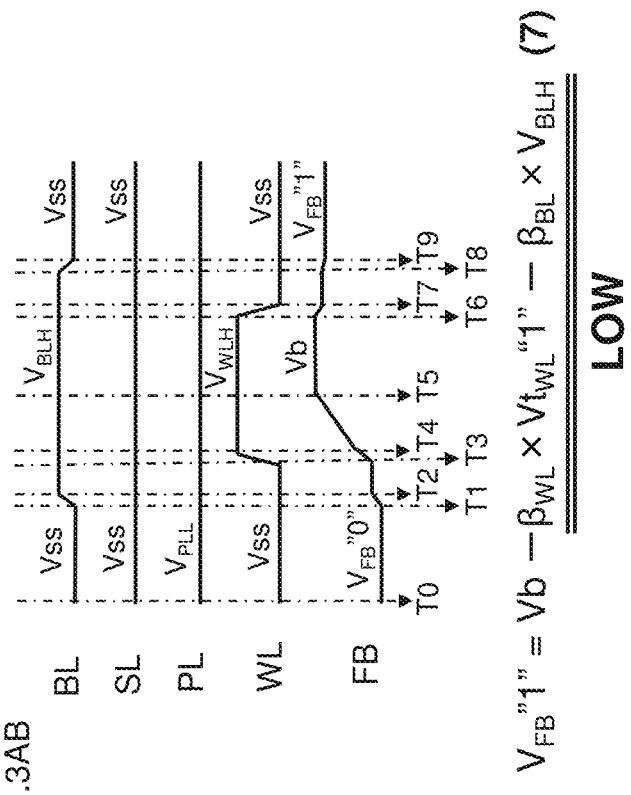
FIG.3AC 1-WRITTEN STATE

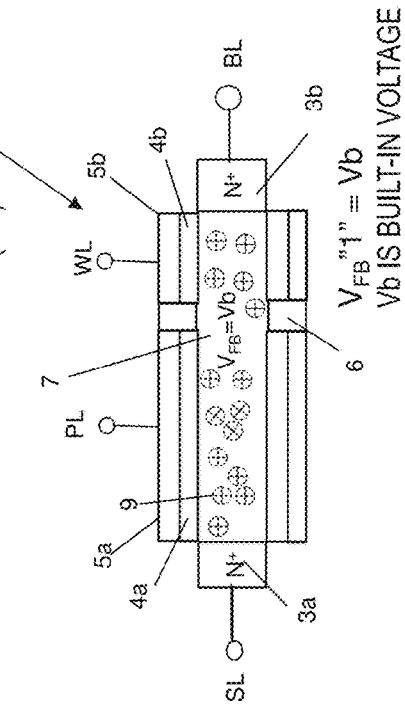

FIG. 4BA TIMING CHART OF "0" PAGE ERASE OPERATION

T3 TO T4: FIRST PERIOD
T5 TO T6: SECOND PERIOD
T9 TO T10: THIRD PERIOD

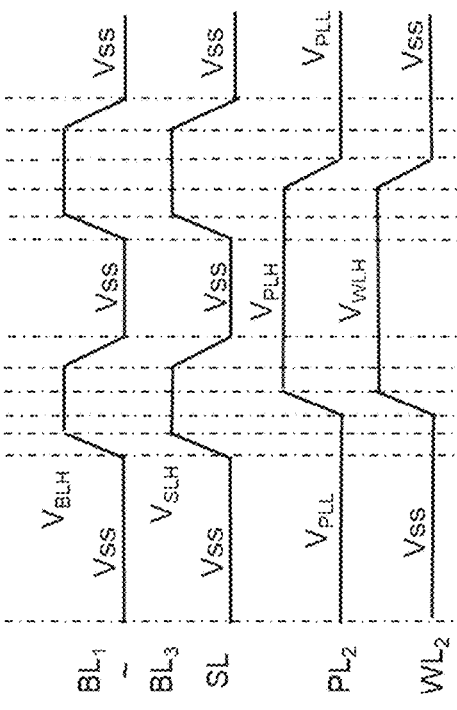

FIG. 4BC IN "0" ERASE OPERATION, POSITIVE HOLE GROUPS 9 ARE DISCHARGED (T5 TO T6)

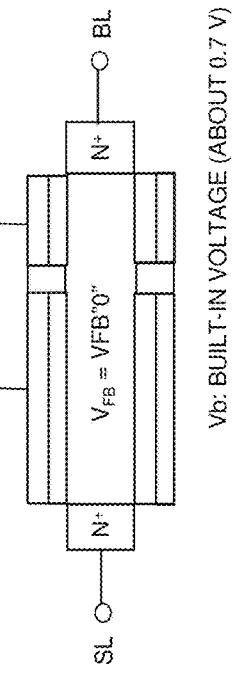

FIG. 4BB 1-WRITTEN STATE (T0)

$V_{FB}\text{"1"} = Vb$  Vb IS BUILT-IN VOLTAGE $V_{FB}\text{"1"} = Vb - \beta_{WL} \times Vt_{WL}\text{"1"} - \beta_{BL} \times V_{BLH}$ (7)

$V_{FB}\text{"0"} = Vb - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$- \beta_{WL} \times Vt_{WL}\text{"1"} - \beta_{BL} \times V_{BLH}$ (9)

IN "0" ERASE OPERATION, WORD LINE WL AND PLATE LINE PL ARE CAPACITIVELY COUPLED TO CHANNEL REGION 7 (T9 TO T10)

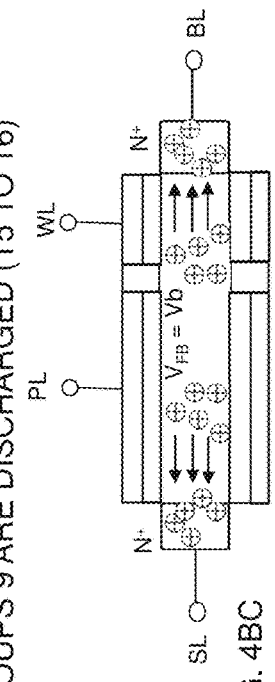

Vb: BUILT-IN VOLTAGE (ABOUT 0.7 V)

FIG. 4BD

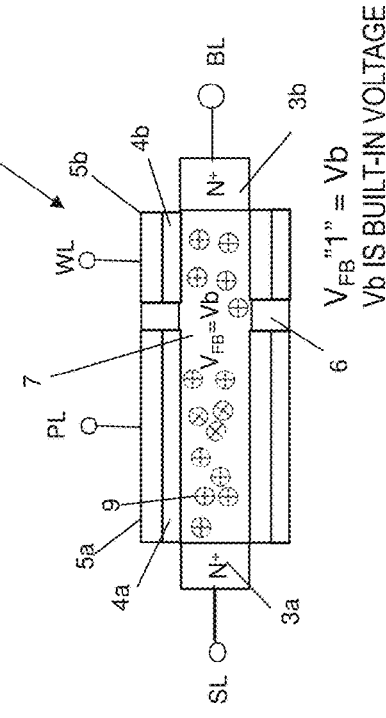

FIG. 4DA TIMING CHART OF "0" PAGE ERASE OPERATION

T3 TO T4: FIRST PERIOD
T5 TO T6: SECOND PERIOD
T9 TO T10: THIRD PERIOD

IN "0" ERASE OPERATION, POSITIVE HOLE GROUPS 9 ARE DISCHARGED (T5 TO T6)

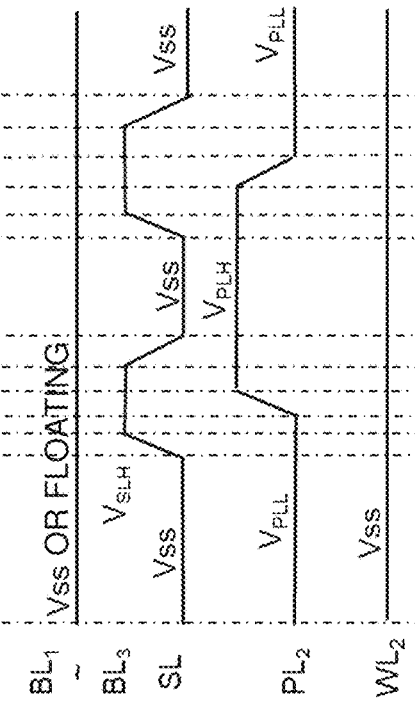

FIG. 4DB 1-WRITTEN STATE (T0)

$V_{FB}\text{"1"} = Vb$
Vb IS BUILT-IN VOLTAGE (7)

$V_{FB}\text{"0"} = Vb - \beta_{WL} \times V_{WLH} - \beta_{PL} \times (V_{PLH} - V_{PLL}) - \beta_{BL} \times V_{BLH}$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL}) - \beta_{WL} \times Vt_{WL}\text{"1"} - \beta_{BL} \times V_{BLH}$ (9)

IN "0" ERASE OPERATION, WORD LINE WL AND PLATE LINE PL ARE CAPACITIVELY COUPLED TO CHANNEL REGION 7 (T9 TO T10)

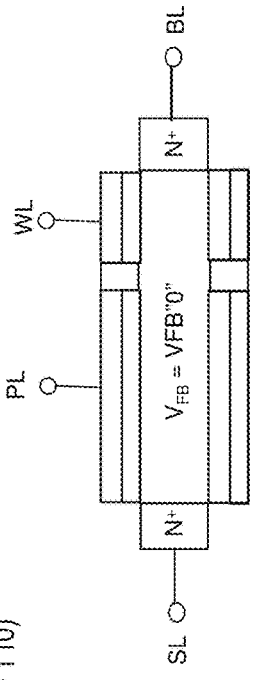

FIG. 4DC

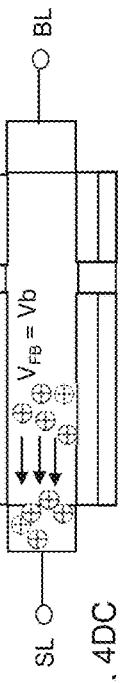

Vb: BUILT-IN VOLTAGE (ABOUT 0.7 V)

FIG. 4DD

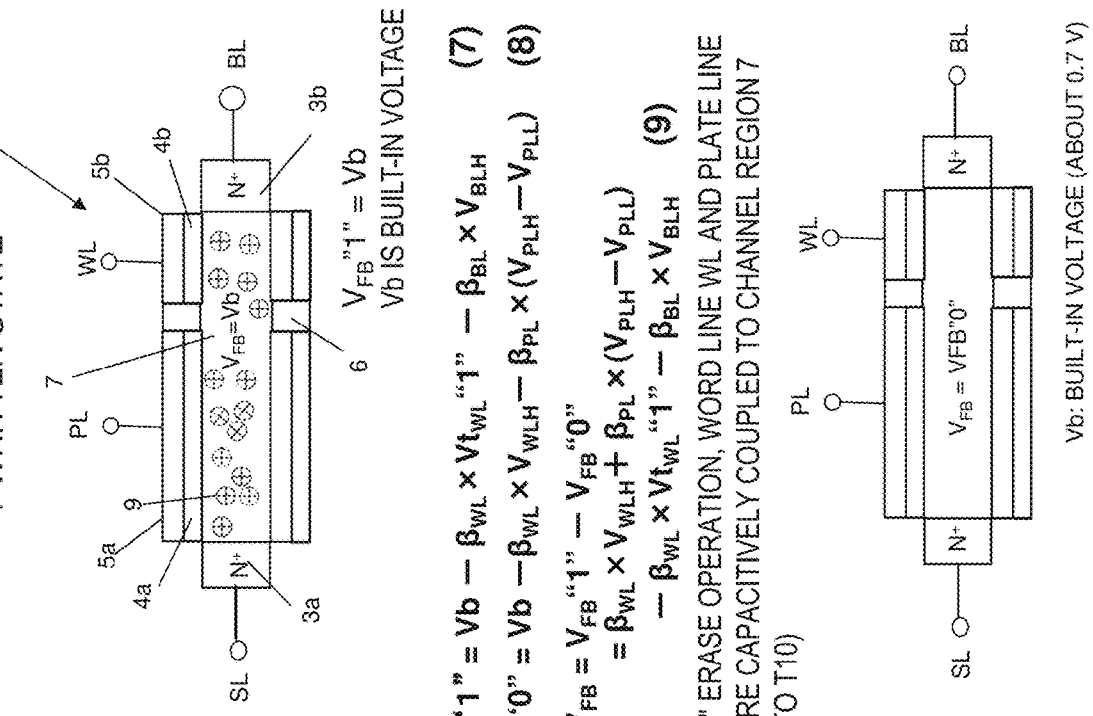

FIG. 4EA TIMING CHART OF "0" PAGE ERASE OPERATION

FIG. 4EB 1-WRITTEN STATE

T3 TO T4: FIRST PERIOD
T5 TO T6: SECOND PERIOD
T9 TO T10: THIRD PERIOD

IN "0" ERASE OPERATION, POSITIVE HOLE GROUPS 9 ARE DISCHARGED (T5 TO T6)

FIG. 4EC $V_{FB}"1" = Vb$
Vb IS BUILT-IN VOLTAGE $V_{FB}"1" = Vb - \beta_{WL} \times Vt_{WL}"1" - \beta_{BL} \times V_{BLH}$ (7)
$V_{FB}"0" = Vb - \beta_{WL} \times V_{WLH} - \beta_{PL} \times (V_{PLH} - V_{PLL})$ (8)
$\Delta V_{FB} = V_{FB}"1" - V_{FB}"0"$
$= \beta_{WL} \times V_{WLH} + \beta_{PL} \times (V_{PLH} - V_{PLL})$
$\quad - \beta_{WL} \times Vt_{WL}"1" - \beta_{BL} \times V_{BLH}$ (9)

IN "0" ERASE OPERATION, WORD LINE WL AND PLATE LINE PL ARE CAPACITIVELY COUPLED TO CHANNEL REGION 7 (T9 TO T10)

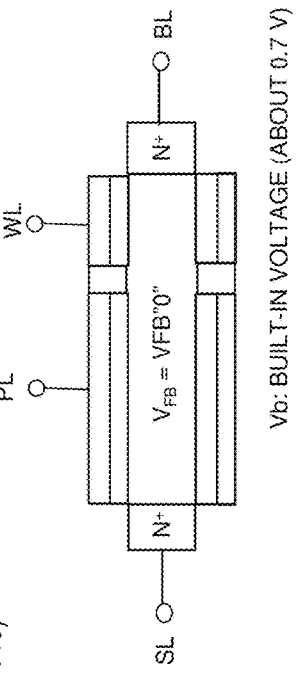

Vb: BUILT-IN VOLTAGE (ABOUT 0.7 V)

FIG. 4ED $$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

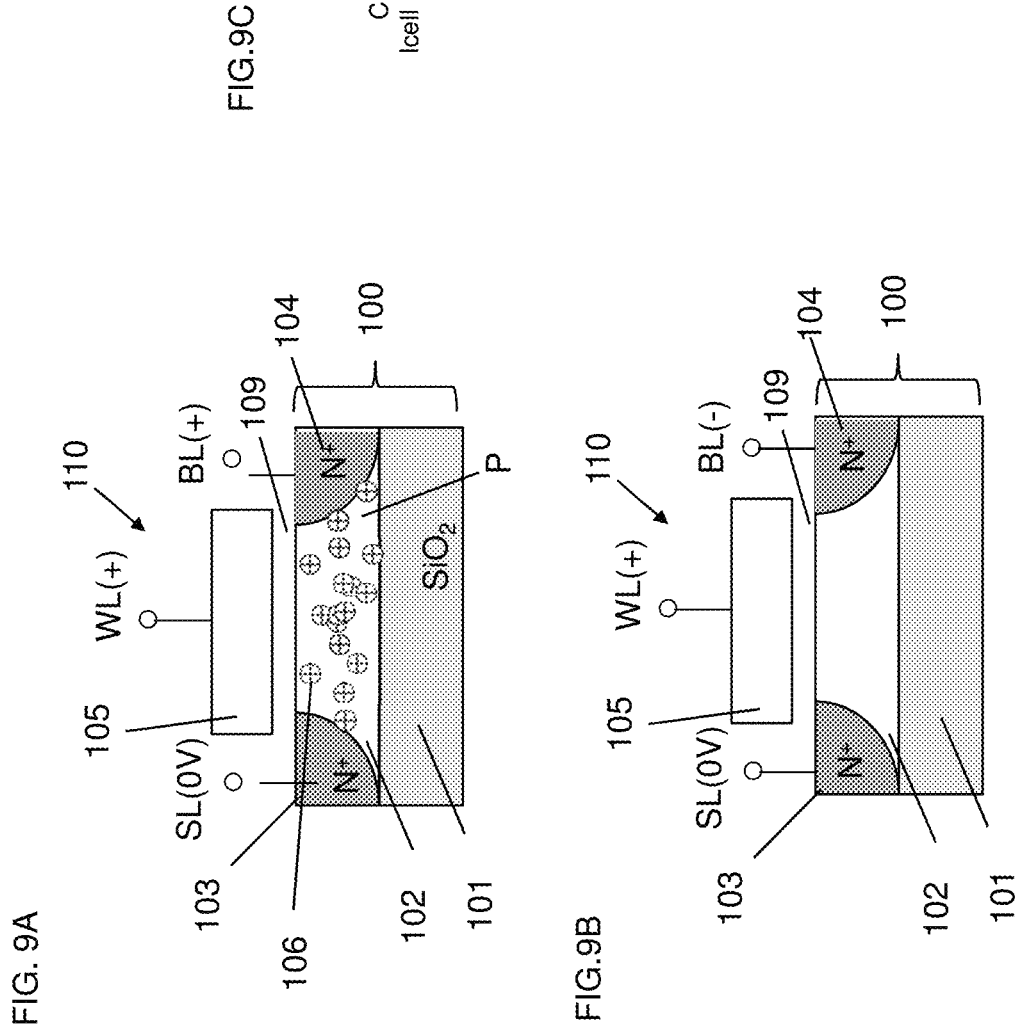

US 11,990,204 B2

MEMORY DEVICE USING SEMICONDUCTOR ELEMENT

CROSS-REFERENCE TO RELATED APPLICATIONS

This application claims priority to PCT/JP2021/025397 filed Jul. 6, 2021, the enter content of which is incorporated herein by reference.

TECHNICAL FIELD

The present invention relates to a memory device using a semiconductor element.

BACKGROUND ART

In recent years, there has been demand for greater packaging density and higher performance in LSI (Large Scale Integration) technology development.

With a typical planar MOS transistor, a channel extends in a horizontal direction along an upper surface of a semiconductor substrate. In contrast, a channel of an SGT extends in a direction perpendicular to an upper surface of a semiconductor substrate (see, for example, Patent Literature 1 and Non Patent Literature 1). Consequently, the SGT enables greater packaging density of semiconductor devices than does the planar MOS transistor. The use of the SGT as a select transistor enables high integration of a DRAM (Dynamic Random Access Memory; see, for example, Non Patent Literature 2) connected with a capacitor, a PCM (Phase Change Memory; see, for example, Non Patent Literature 3) connected with a variable resistance element, an RRAM (Resistive Random Access Memory; see, for example, Non Patent Literature 4), and an MRAM (Magneto-resistive Random Access Memory; see, for example, Non Patent Literature 5) that varies resistance by changing an orientation of a magnetic spin using a current. There is also a capacitorless DRAM memory cell made up of a single MOS transistor (see, for example, Non Patent Literature 7). The present application relates to a dynamic flash memory that can be made up solely of a MOS transistor without a variable resistance element or a capacitor.

FIGS. 7A to 7D show a write operation of the capacitorless DRAM memory cell made up of a single MOS transistor, FIGS. 8A and 8B show problems in operations, and FIGS. 9A to 9C show a read operation (see Non Patent Literatures 7 to 10). FIG. 7A shows a 1-written state. Here, a memory cell is formed on an SOI substrate 100 and is made up of a source $N^+$ layer 103 (hereinafter a semiconductor region containing a high concentration of donor impurities will be referred to as an "$N^+$ layer") connected with a source line SL, a drain $N^+$ layer 104 connected with a bit line BL, a gate conductive layer 105 connected with a word line WL, and a floating body 102 of a MOS transistor 110. That is, a DRAM memory cell is made up of a single MOS transistor 110 without a capacitor. Note that a $SiO_2$ layer 101 of the SOI substrate is placed in contact with an undersurface of the floating body 102. When "1" is written into the memory cell made up of the single MOS transistor 110, the MOS transistor 110 is operated in a saturation region. That is, an electron channel 107 extending from the source $N^+$ layer 103 has a pinch-off point 108 and does not reach the drain $N^+$ layer 104 connected with a bit line. If the MOS transistor 110 is operated with a gate voltage set to approximately ½ a drain voltage by applying high voltages to the bit line BL connected to the drain $N^+$ layer and the word line WL connected to the gate conductive layer 105 as described above, electric field strength is maximized at the pinch-off point 108 in the vicinity of the drain $N^+$ layer 104. As a result, accelerated electrons flowing from the source $N^+$ layer 103 towards the drain $N^+$ layer 104 collide with a Si lattice, and electron-hole pairs are created by kinetic energy lost at that moment (impact ionization phenomenon). Most of the generated electrons (not shown) reach the drain $N^+$ layer 104. Only a few very hot electrons reach the gate conductive layer 105 by jumping over a gate oxide film 109. Positive holes 106 generated at the same time charge the floating body 102. In this case, the generated positive holes contribute as an increment to majority carriers because the floating body 102 is made of p-type Si. The floating body 102 is filled with the generated positive holes 106, and if a voltage of the floating body 102 becomes higher than the source $N^+$ layer 103 by Vb or more, positive holes generated further are discharged to the source $N^+$ layer 103, where Vb is a built-in voltage of a pn junction between the source $N^+$ layer 103 and the floating body 102 in a p-layer, and is approximately 0.7 V. FIG. 7B shows how the floating body 102 is charged to saturation by the generated positive holes 106.

Next, a "0" writing operation of a memory cell 110 will be described using FIG. 7C. There are a memory cell 110 that writes "1" and a memory cell 110 that writes "0" randomly to a common select word line WL. FIG. 7C shows how a 1-written state is changed to a 0-written state. To write "0," the voltage of bit line BL is negatively biased and a pn junction between the drain $N^+$ layer 104 and the floating body 102 in the p-layer is forward biased. As a result, positive holes 106 generated in the floating body 102 beforehand in the previous cycle flows to the drain $N^+$ layer 104 connected to the bit line BL. Once the write operation finishes, two states of the memory cell follow: a state in which the memory cell 110 is filled with the generated positive holes 106 (FIG. 7B) and a state in which the generated positive holes are discharged from the memory cell 110 (FIG. 7C). The floating body 102 of the memory cell 110 filled with the positive holes 106 is higher in potential than the floating body 102 free of generated positive holes. Therefore, a threshold voltage of the memory cell 110 written with "1" is lower than a threshold voltage of the memory cell 110 written with "0." FIG. 7D shows how this looks like.

Next, problems in operations of a memory cell made up of the single MOS transistor 110 will be described using FIGS. 8A and 8B. As shown in FIG. 8A, capacitance $C_{FB}$ of the floating body is the sum total of capacitance $C_{WL}$ between a gate connected with a word line and the floating body, junction capacitance $C_{SL}$ of a pn junction between the source $N^+$ layer 103 connected with a source line and the floating body 102, and junction capacitance $C_{BL}$ of a pn junction between the drain $N^+$ layer 104 connected with the bit line and the floating body 102; and is given by $$C_{FB}=C_{WL}+C_{BL}+C_{SL} \quad (10)$$

A capacitive coupling ratio $\beta_{WL}$ between the gate connected with a word line and the floating body is given by $$\beta_{WL}=C_{WL}/(C_{WL}+C_{BL}+C_{SL}) \quad (11)$$

Therefore, if a word line voltage $V_{WL}$ swings during reading or writing, a voltage of the floating body 102 serving as a memory node (contact) of the memory cell is also affected. FIG. 8B shows how this looks like. If a word line voltage $V_{WL}$ rises from 0 V to $V_{WLH}$ during reading or writing, a voltage $V_{FB}$ of the floating body 102 rises from $V_{FB1}$ to $V_{FB2}$ due to capacitive coupling with the word line, where $V_{FB1}$ is an initial voltage before the word line voltage changes. The amount of change $\Delta V_{FB}$ in voltage is given by $$\Delta V_{FB} = V_{FB2} - V_{FB1} = \beta_{WL} \times V_{WLH} \qquad (12)$$

In $\beta_{WL}$ in Eq. (11), a contribution ratio of $C_{WL}$ is large, and is expressed, for example, by $C_{WL}:C_{BL}:C_{SL}=8:1:1$. In this case, $\beta_{WL}=0.8$. If the word line, for example, is 5 V during writing and 0 V after the end of writing, due to capacitive coupling of the word line WL and floating body 102, the floating body 102 is subjected to amplitude noise as high as 5 V×$\beta_{WL}$=4 V. This poses a problem in that a sufficient margin of potential difference between a logic 1 potential and logic 0 potential of the floating body 102 cannot be secured during writing.

FIGS. 9A to 9C show a read operation, where FIG. 9A shows a 1-written state and FIG. 9B shows a 0-written state. Actually, however, even if Vb is written into the floating body 102 by writing of "1," if the word line returns to 0 V when the writing is finished, the floating body 102 is lowered to a negative bias. When "0" is being written, because the floating body 102 is negatively biased further, a sufficiently large margin of potential difference cannot be secured between "1" and "0" during writing as shown in FIG. 9C, making it difficult to commercially introduce really capacitorless DRAM memory cells.

CITATION LIST

Patent Literature

[Patent Literature 1] Japanese Patent Laid-Open No. 2-188966
[Patent Literature 2] Japanese Patent Laid-Open No. 3-171768
[Patent Literature 3] Japanese Patent No. 3957774

Non Patent Literature

[Non Patent Literature 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[Non Patent Literature 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[Non Patent Literature 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[Non Patent Literature 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)
[Non Patent Literature 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[Non Patent Literature 6] M. G. Ertosum, K. Lim, C. Park, J. Oh, P. Kirsch, and K. C. Saraswat: "Novel Capacitor-less Single-Transistor Charge-Trap DRAM (1T CT DRAM) Utilizing Electron," IEEE Electron Device Letter, Vol. 31, No. 5, pp. 405-407 (2010)
[Non Patent Literature 7] J. Wan, L. Rojer, A. Zaslaysky, and S. Critoloveanu: "A Compact CapacitorLess High-Speed DRAM Using Field Effect-Controlled Charge Regeneration," Electron Device Letters, Vol. 35, No. 2, pp. 179-181 (2012)
[Non Patent Literature 8] T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[Non Patent Literature 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10] E. Yoshida: "A Capacitorless 1T-DRAM Technology Using Gate-Induced Drain-Leakage (GIDL) Current for Low-Power and High-Speed Embedded Memory," IEEE IEDM (2006).
[Non Patent Literature 11] J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, May 2006.
[Non Patent Literature 12] N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13] H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7 pp).
[Non Patent Literature 14] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

A capacitorless single-transistor DRAM (gain cell) has a problem in that there is large capacitive coupling between a word line and a floating body and if potential of the word line swings during data read or write, the swings are transmitted as noise directly to the floating body. This causes misreading or erroneous rewriting of stored data, making it difficult to put the capacitorless single-transistor DRAM (gain cell) to practical use.

Solution to Problem

To solve the above problem, a memory device that uses a semiconductor element according to the present invention is a memory device, in which a page is made up of a plurality of memory cells arranged in a row direction of a substrate, and a plurality of the pages is arranged in a column direction, each of the memory cells contained in each of the pages includes:
- a semiconductor base material erected on the substrate in a vertical direction of the substrate or extended on the substrate in a horizontal direction,
- a first impurity layer and a second impurity layer provided on opposite ends of the semiconductor base material,
- a first gate insulating layer placed in contact with, or close to, the first impurity layer, partially or entirely surrounding a lateral surface of the semiconductor base material between the first impurity layer and the second impurity layer,
- a second gate insulating layer joined to the first gate insulating layer and placed in contact with, or close to, the second impurity layer, surrounding the lateral surface of the semiconductor base material,
- a first gate conductor layer covering part or all of the first gate insulating layer,
- a second gate conductor layer covering the second gate insulating layer, and
- a channel semiconductor layer in which the semiconductor base material is covered with the first gate insulating layer and the second gate insulating layer;
- a positive hole group generated by an impact ionization phenomenon is held in the channel semiconductor layer by controlling voltages applied to the first gate conductor layer, the second gate conductor layer, the first impurity layer, and the second impurity layer;
- during a page write operation, a voltage of the channel semiconductor layer is set to a first data retention voltage higher than a voltage/voltages of one or both of the first impurity layer and the second impurity layer;
- during a page erase operation, by controlling voltages applied to the first impurity layer, the second impurity layer, the first gate conductor layer, and the second gate conductor layer, the positive hole group is pulled out from one or both of the first impurity layer and the second impurity layer, and the voltage of the channel semiconductor layer is set to a second data retention voltage lower than the first data retention voltage;
- the first impurity layer of the memory cell is connected with a source line, the second impurity layer is connected with a bit line, one of the first gate conductor layer and the second gate conductor layer is connected with a word line, and another is connected with a drive control line;
- the bit line is connected to a sense amplifier circuit via a switch circuit;
- at least one of word lines is selected and a refresh operation is performed to return the voltage of the channel semiconductor layer of the selected word line to the first data retention voltage by controlling voltages applied to the selected word line, the drive control line, the source line, and the bit line and thereby forming the positive hole groups by an impact ionization phenomenon in the channel semiconductor layer of the memory cell in which the voltage of the channel semiconductor layer is set to the first data retention voltage using the page write operation; and
- concurrently with the refresh operation, a page read operation is performed to read page data of a first memory cell group belonging to a first page into the sense amplifier circuit by placing the switch circuit in a nonconducting state (first invention).

According to a second invention, in the first invention described above, during the refresh operation, a select-all-word-lines signal is input to the row decoder circuit to select all the word lines in the memory cell block (second invention).

According to a third invention, in the first invention described above, the drive control line of the memory cells arranged in the row direction and in the column direction is disposed in common to adjacent ones of the memory cells (third invention).

According to a fourth invention, in the first invention described above, the memory device performs: an operation of writing the page data into the sense amplifier circuit during the refresh operation with the switch circuit kept in a nonconducting state;
- the page erase operation with respect to the first page after an end of the refresh operation; and
- the page write operation to write the page data of the sense amplifier circuit into the first memory cell group with the switch circuit kept in a conducting state (fourth invention).

According to a fifth invention, in the first invention described above, first gate capacitance between the first gate conductor layer and the channel semiconductor layer is higher than second gate capacitance between the second gate conductor layer and the channel semiconductor layer (fifth invention).

According to a sixth invention, in the first invention described above, when viewed in an axial direction of the semiconductor base material, the first gate conductor layer is separated into at least two conductor layers by surrounding the first gate insulating layer (sixth invention).

BRIEF DESCRIPTION OF DRAWINGS

FIGS. 2A to 2C are diagrams explaining effects produced when gate capacitance of a first gate conductor layer 5a connected to a plate line PL of the memory device having the SGT according to the first embodiment is made higher than gate capacitance of a second gate conductor layer 5b connected with a word line WL;

FIGS. 3AA to 3AC are diagrams for explaining a write operation mechanism of the memory device having the SGT according to the first embodiment;

FIGS. 4BA to 4BD are diagrams for explaining the page erase operation mechanism of the memory device having the SGT according to the first embodiment;

FIGS. 4DA to 4DD are diagrams for explaining the page erase operation mechanism of the memory device having the SGT according to the first embodiment;

FIGS. 4EA to 4ED are diagrams for explaining the page erase operation mechanism of the memory device having the SGT according to the first embodiment;

FIGS. 9A to 9C are diagrams for explaining a read operation of a capacitorless DRAM memory cell according to a conventional example.

MODE FOR CARRYING OUT THE INVENTION

Embodiments of a memory device (hereinafter referred to as a dynamic flash memory), which uses a semiconductor element, according to the present invention will be described below with reference to the drawings.

First Embodiment

A structure and operation mechanism of a dynamic flash memory cell according to a first embodiment of the present invention will be described below using FIGS. 1 to 5A to 5C. The structure of the dynamic flash memory cell will be described using FIG. 1. Then, using FIGS. 2A to 2C, description will be given of effects produced when gate capacitance of a first gate conductor layer 5a connected to a plate line PL is made higher than gate capacitance of a second gate conductor layer 5b connected with a word line WL. Then, a data write operation mechanism will be described using FIGS. 3AA to 3AC and 3B, a data erase operation mechanism will be described using FIGS. 4A to 4EA-4ED, and a data read operation mechanism will be described using FIGS. 5A to 5C.

Figure 1:
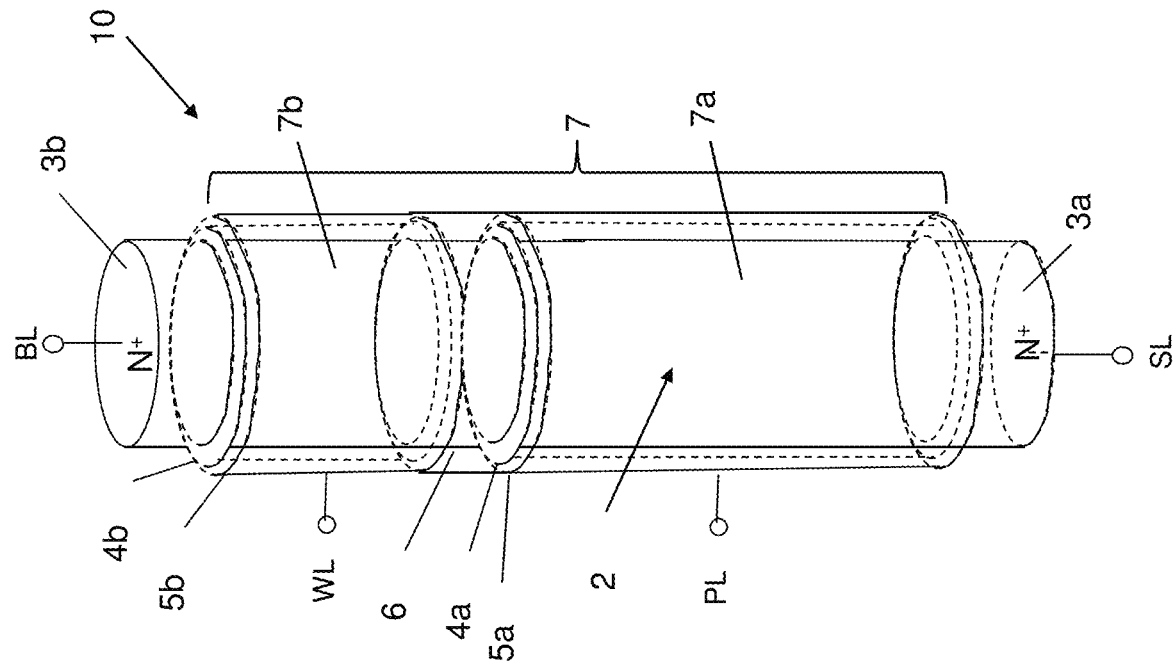
FIG. 1 is a structural diagram of a memory device having an SGT according to a first embodiment.

The structure of the dynamic flash memory cell according to the first embodiment of the present invention is shown in FIG. 1. N$^+$ layers 3a and 3b (which are examples of a "first impurity layer" and a "second impurity layer" described in Claims), one of which serves as a source while the other serves as a drain, are formed at upper and lower positions in a silicon semiconductor pillar 2 (hereinafter, a silicon semiconductor pillar, which is an example of a "semiconductor base material" described in Claims, will be referred to as a "Si pillar") formed on a substrate and having a P or i conductivity type (intrinsic type). That part of the Si pillar 2 which is between the N$^+$ layers 3a and 3b that serve as the source and the drain is a channel region 7 (which is an example of a "channel semiconductor layer" described in Claims). A first gate insulating layer 4a (which is an example of a "first gate insulating layer" described in Claims) and a second gate insulating layer 4b (which is an example of a "second gate insulating layer" described in Claims) are formed by surrounding the channel region 7. The first gate insulating layer 4a and the second gate insulating layer 4b are placed, respectively, in contact with, or close to, the N$^+$ layers 3a and 3b that serve as the source and the drain. The first gate conductor layer 5a (which is an example of a "first gate conductor layer" described in Claims) and the second gate conductor layer 5b (which is an example of a "second gate conductor layer" described in Claims) are formed by surrounding the first gate insulating layer 4a and the second gate insulating layer 4b, respectively. The first gate conductor layer 5a and the second gate conductor layer 5b are separated by an insulating layer 6. The channel region 7 between the N$^+$ layers 3a and 3b is made up of a first channel Si layer 7a surrounded by the first gate insulating layer 4a and a second channel Si layer 7b surrounded by the second gate insulating layer 4b. This results in formation of a dynamic flash memory cell 10 made up of the N$^+$ layers 3a and 3b, which are to become the source and the drain, the channel region 7, the first gate insulating layer 4a, the second gate insulating layer 4b, the first gate conductor layer 5a, and the second gate conductor layer 5b. Then, the N$^+$ layer 3a to become the source is connected to a source line SL (which is an example of a "source line" described in Claims), the N$^+$ layer 3b to become the drain is connected to a bit line BL (which is an example of a "bit line BL" described in Claims), the first gate conductor layer 5a is connected to the plate line PL (which is an example of a "drive control line" described in Claims), and the second gate conductor layer 5b is connected to the word line WL (which is an example of a "word line" described in Claims). Desirably the gate capacitance of the first gate conductor layer 5a connected with the plate line PL is structured to be higher than the gate capacitance of the second gate conductor layer 5b connected with the word line WL.

Note that in FIG. 1, the first gate conductor layer 5a is made larger in gate length than the second gate conductor layer 5b such that the first gate conductor layer 5a connected to the plate line PL will be higher in gate capacitance than the second gate conductor layer 5b connected with the word line WL. In addition, however, instead of making the first gate conductor layer 5a larger in gate length than the second gate conductor layer 5b, film thicknesses of the gate insulating layers may be changed such that a gate insulating film of the first gate insulating layer 4a will be smaller in film thickness than a gate insulating film of the second gate insulating layer 4b. Also, materials of the gate insulating layers may be varied in permittivity such that the gate insulating film of the first gate insulating layer 4a will be higher in permittivity than the gate insulating film of the second gate insulating layer 4b. Besides, the first gate conductor layer 5a connected to the plate line PL may be made higher in gate capacitance than the second gate conductor layer 5b connected with the word line WL by combining any of the following: lengths of the gate conductor layers 5a and 5b, and film thicknesses and permittivities of the gate insulating layers 4a and 4b.

FIGS. 2A to 2C are diagrams explaining effects produced when the gate capacitance of the first gate conductor layer 5a connected to the plate line PL is made higher than the gate capacitance of the second gate conductor layer 5b connected with the word line WL.

FIG. 2A is a structural diagram showing only main part the dynamic flash memory cell according to the first embodiment of the present invention in a simplified manner. The dynamic flash memory cell is connected with the bit line BL, the word line WL, the plate line PL, and the source line SL, whose voltage states determine a potential state of the channel region 7.

FIG. 2B is a diagram for explaining relationships among capacitances. Capacitance $C_{FB}$ of the channel region 7 is the sum total of capacitance $C_{WL}$ between the gate conductor layer 5b connected with the word line WL and the channel region 7, capacitance $C_{PL}$ between the gate conductor layer 5a connected with the plate line PL and the channel region 7, junction capacitance $C_{SL}$ of a pn junction between the source N⁺ layer 3a connected with the source line SL and the channel region 7, and junction capacitance $C_{BL}$ of a pn junction between the drain N⁺ layer 3b connected with the bit line BL and the channel region 7, and is given by $$C_{FB}=C_{WL}+C_{PL}+C_{BL}+C_{SL} \quad (1)$$

Therefore, a coupling ratio $\beta_{WL}$ between the word line WL and the channel region 7, a coupling ratio $\beta_{PL}$ between the plate line PL and the channel region 7, a coupling ratio $\beta_{BL}$ between the bit line BL and the channel region 7, a coupling ratio $\beta_{BL}$ between the source line SL and the channel region 7 are given, respectively, by $$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4) \text{ and}$$

$$\beta_{SL}=C_{SL}/(C_{WL}+C_{PL}+C_{BL}+C_{SL}) \quad (5),$$

where $C_{PL}>C_{WL}$, and thus $\beta_{PL}>\beta_{WL}$.

FIG. 2C is a diagram for explaining changes of a voltage $V_{FB}$ in the channel region 7 when a voltage $V_{WL}$ of the word line WL rises during read and write operations and falls subsequently. Here, when the voltage $V_{WL}$ of the word line WL rises from 0 V to a high-voltage state $V_{WLH}$ and the voltage $V_{FB}$ of the channel region 7 changes from a low-voltage state $V_{FBL}$ to a high-voltage state $V_{FBH}$, a potential difference $\Delta_{VFB}$ is given by $$\Delta V_{FB}=V_{FBH}-V_{FBL}-\beta_{WL}\times V_{WLH} \quad (6)$$

Because the coupling ratio $\beta_{WL}$ between the word line WL and the channel region 7 is low and the coupling ratio $\beta_{PL}$ between the plate line PL and the channel region 7 is high, $\Delta_{VFB}$ is low and even if the voltage $V_{WL}$ of the word line WL rises and falls during read and write operations, the voltage $V_{FB}$ of the channel region 7 almost does not change.

Figure 3B:
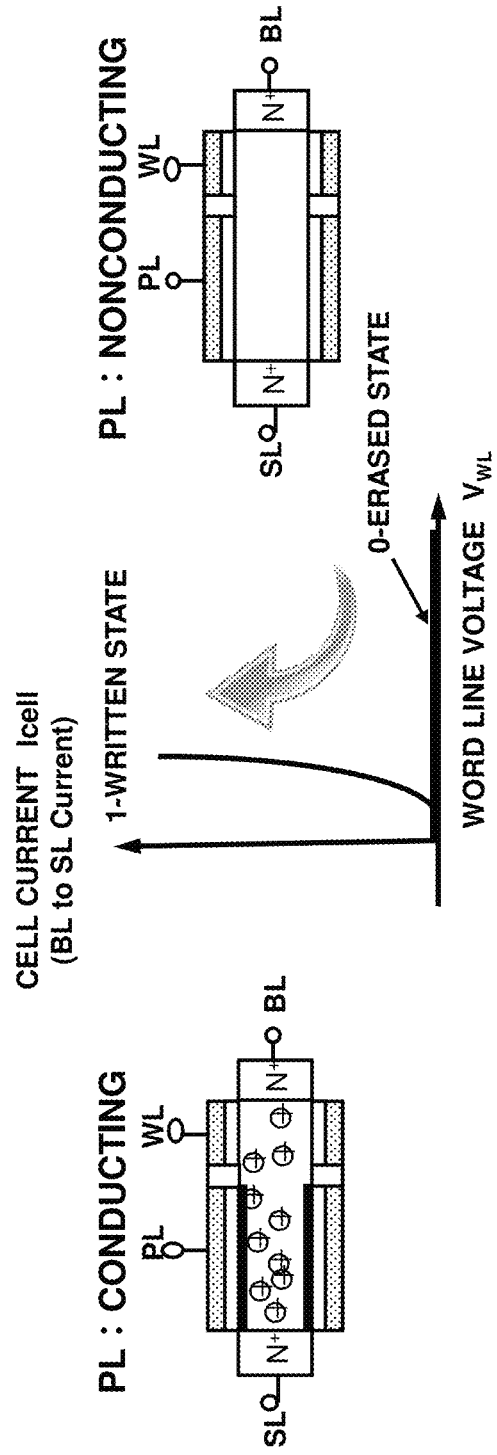
FIG. 3B is a diagram for explaining the write operation mechanism of the memory device having the SGT according to the first embodiment.

A memory write operation (which is an example of a "page write operation" described in Claims) of the dynamic flash memory cell according to the first embodiment of the present invention is shown in FIGS. 3AA to 3AC and FIG. 3B. FIG. 3AA shows a mechanism of the write operation and FIG. 3AB shows operation waveforms of the bit line BL, source line SL, plate line PL, word line WL, and channel region 7, which is indicated as the floating body FB. At time T0, the dynamic flash memory cell is in a 0-erased state and the voltage of the channel region 7 is $V_{FB}$ "0." Besides, Vss is applied to the bit line BL, the source line SL, and the word line WL while $V_{PLL}$ is applied to the plate line PL. Here, for example, Vss is 0 V and $V_{PLL}$ is 2 V. Next, from time T1 to time T2, when the bit line BL rises from Vss to $V_{BLH}$, for example, if Vss is 0 V, the voltage of the channel region 7 becomes $V_{FB}$ "0"+$\beta_{BL}\times V_{BLH}$ as a result of capacitive coupling between the bit line BL and the channel region 7.

Next, a write operation of the dynamic flash memory cell will be described using FIGS. 3AA and 3AB. From time T3 to time T4, the word line WL rises from Vss to $V_{WLH}$. Consequently, when the second gate conductor layer 5b connected with the word line WL sets a 0-erasing threshold voltage of a second N-channel MOS transistor region surrounding the channel region 7 to $Vt_{WL}$ "0," as the voltage of the word line WL rises, from Vss to $Vt_{WL}$ "0," the voltage of the channel region 7 becomes $V_{FB}$ "0"+$\beta_{BL}\times V_{BLH}$+$\beta_{WL}\times Vt_{WL}$ "0" as a result of second capacitive coupling between the word line WL and the channel region 7. If the voltage of the word line WL rises to or above $Vt_{WL}$ "0," an annular inversion layer 12b is formed in the channel region 7 on an inner circumference of the second gate conductor layer 5b, blocking the second capacitive coupling between the word line WL and the channel region 7.

Description of the write operation of the dynamic flash memory cell will be continued using FIGS. 3AA and 3AB. From time T3 to time T4, for example, $V_{PLL}$=2 V is input constantly to the first gate conductor layer 5a connected with the plate line PL, raising the second gate conductor layer 5b connected with the word line WL to, for example, $V_{WLH}$=4 V. Consequently, as shown in FIG. 3AA, an annular inversion layer 12a is formed in the channel region 7 on an inner circumference of the first gate conductor layer 5a connected with the plate line PL, with a pinch-off point existing in the inversion layer 12a. As a result, a first N-channel MOS transistor region having the first gate conductor layer 5a operates in a saturation region. On the other hand, the second N-channel MOS transistor region having the second gate conductor layer 5b that is connected with the word line WL operates in a linear region. As a result, no pinch-off point exists in the channel region 7 on the inner circumference of the second gate conductor layer 5b connected with the word line WL, and the inversion layer 12b is formed on the entire inner circumference of the second gate conductor layer 5b. The inversion layer 12b formed on the entire inner circumference of the second gate conductor layer 5b connected with the word line WL operates as a virtual drain of the second N-channel MOS transistor region having the second gate conductor layer 5b that is connected with the word line WL. As a result, an electric field is maximized and an impact ionization phenomenon occurs in a first boundary region of the channel region 7 between the first N-channel MOS transistor region having the first gate conductor layer 5a that is connected in series and the second N-channel MOS transistor region having the second gate conductor layer 5b. The first boundary region is a source-side region viewed from the second N-channel MOS transistor region having the second gate conductor layer 5b that is connected with the word line WL, and thus the phenomenon is called a source-side impact ionization phenomenon. As a result of the source-side impact ionization phenomenon, electrons flow from the N⁺ layer 3a connected with the source line SL toward the N⁺ layer 3b connected with the bit line. Accelerated electrons collide with Si lattice atoms and electron-hole pairs are created by kinetic energy of the accelerated electrons. Part of the generated electrons flows to the first gate conductor layer 5a and the second gate conductor layer 5b, but most of the electrons flow to the N⁺ layer 3b connected to the bit line BL (not shown).

As shown in FIG. 3AC, generated positive hole groups 9 (which are examples of a "positive hole group" described in Claims) are majority carriers in the channel region 7 and charge the channel region 7 so as to be positively biased. The N⁺ layer 3a connected with the source line SL is 0 V and thus the channel region 7 is charged to a built-in voltage Vb (approximately 0.7 V) of a pn junction between the N⁺ layer 3a connected with the source line SL and the channel region 7. Once the channel region 7 is charged to be positively biased, threshold voltages of the first N-channel MOS transistor region and second N-channel MOS transistor region fall due to a substrate bias effect.

Description of the write operation of the dynamic flash memory cell will be continued using FIG. 3AB. From time T6 to time T7, the voltage of the word line WL drops from $V_{WLH}$ to Vss. In so doing, the word line WL and the channel region 7 form the second capacitive coupling, but until the voltage $V_{WLH}$ of the word line WL becomes equal to or lower than the threshold voltage $Vt_{WL}$ "1" of the second N-channel MOS transistor region when the voltage of the channel region 7 is Vb, the inversion layer 12b blocks the second capacitive coupling. Therefore, virtual capacitive coupling between the word line WL and the channel region 7 is enabled only when the word line WL becomes equal to or lower than $Vt_{WL}$ "1" and falls to Vss. As a result, the voltage of the channel region 7 becomes Vb−$β_{WL}$×$Vt_{WL}$ "1." Here, $Vt_{WL}$ "1" is lower than $Vt_{WL}$ "0" described above, and thus $β_{WL}$×$Vt_{WL}$ "1" is low.

Description of the write operation of the dynamic flash memory cell will be continued using FIG. 3AB. From time T8 to time T9, the bit line BL drops from $V_{BLH}$ to Vss. Since the bit line BL and the channel region 7 are capacitively coupled, eventually "1"-writing voltage $V_{FB}$ "1" of the channel region 7 becomes as follows.

$$V_{FB} \text{"1"} = Vb - β_{WL} \times Vt_{WL} \text{"1"} - β_{BL} \times V_{BLH} \quad (7)$$

where the coupling ratio $β_{BL}$ between the bit line BL and the channel region 7 is also low. Consequently, as shown in FIG. 3B, the threshold voltage of the second N-channel MOS transistor region of a second channel region 7b connected with the word line WL becomes low. A 1-written state of the channel region 7 is set to a first data retention voltage (which is an example of a "first data retention voltage" described in Claims). A memory write operation is performed and this state is assigned to logical storage data "1."

Note that in the write operation, electron-hole pairs may be generated by an impact ionization phenomenon in a second boundary region between a first impurity layer 3a and a first channel semiconductor layer 7a or in a third boundary region between a second impurity layer 3b and a second channel semiconductor layer 7b rather than in the first boundary region, and the channel region 7 may be charged with the generated positive hole groups 9.

Note that conditions of the voltages applied to the bit lines BL, the source lines SL, the word lines WL, and the plate lines PL as well as the potential of the floating body are exemplary in performing write operations, and other conditions that allow write operations to be performed may be used.

A mechanism of a memory erase operation (which is an example of a "memory erase operation" described in Claims) will be described using FIGS. 4A to 4EA-4ED.

Figure 4A:
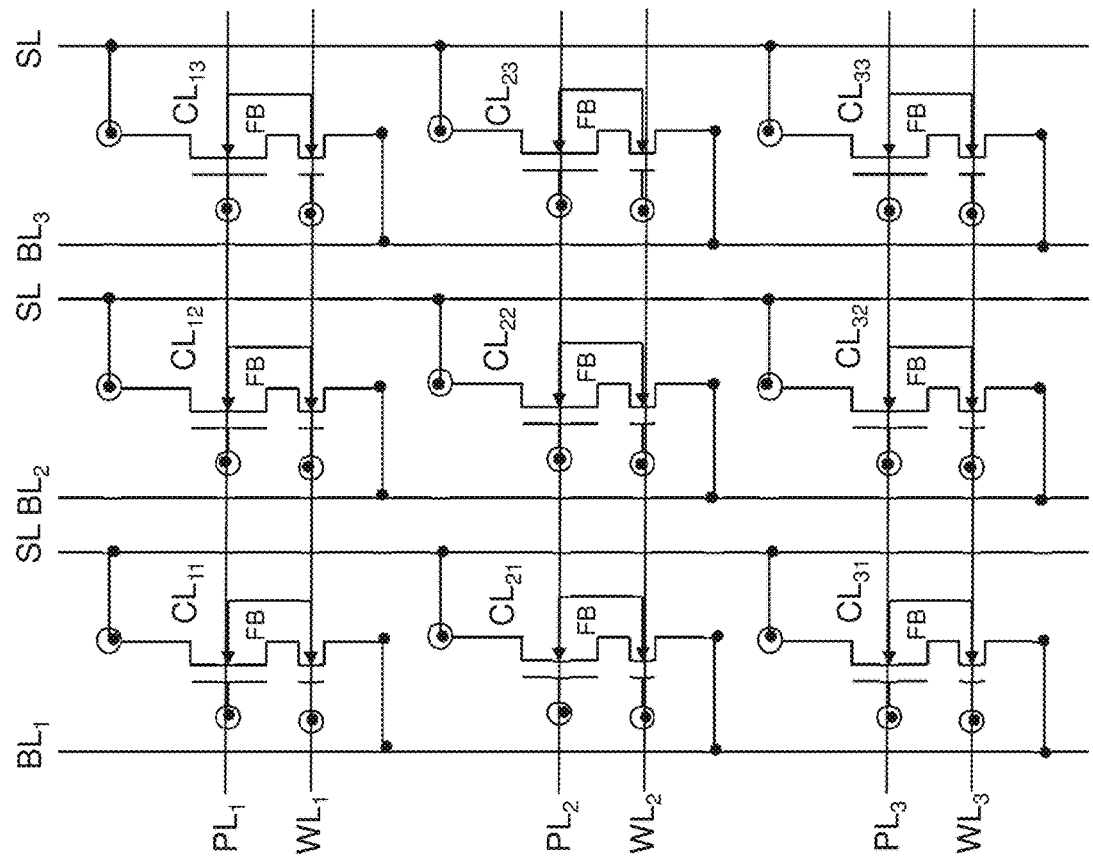
FIG. 4A is a diagram for explaining a page erase operation mechanism of the memory device having the SGT according to the first embodiment.

A circuit diagram of a memory block is shown in FIG. 4A to explain a page erase operation. Whereas 3 rows by 3 columns of memory cells for a total of nine memory cells $CL_{11}$ to $CL_{33}$ are shown here, an actual memory block is larger than this matrix. When memory cells are arrayed in a matrix, one direction of the array is referred to as a "row direction" (or a "row-wise direction") and a direction perpendicular to the row direction is referred to as a "column direction" (or a "column-wise direction"). The memory cells are connected with the respective source lines SL, bit lines $BL_1$ to $BL_3$, plate lines $PL_1$ to $PL_3$, and word lines $WL_1$ to $WL_3$. For example, it is assumed that in this block, a page erase operation is performed by selecting from memory cells $CL_{21}$ to $CL_{23}$ connected with the plate line $PL_2$ and the word line $WL_2$ of a desired page (which is an example of a "page" described in Claims).

A mechanism of a page erase operation will be described using FIGS. 4BA to 4BD and 4C. Here, the channel region 7 between the N$^+$ layers 3a and 3b is electrically separated from the substrate, making up a floating body. FIG. 4BA shows a timing operation waveform diagram of main nodes of the erase operation. In FIG. 4BA, T0 to T12 indicates times from start to end of the erase operation. FIG. 4BB shows that at time T0 before the erase operation, the positive hole groups 9 generated by impact ionization in the previous cycle are stored in the channel region 7. Then, from time T1 to time T2, the bit lines $BL_1$ to $BL_3$ and the source line SL change from Vss to a high-voltage state of $V_{BLH}$ or $V_{SLH}$. Here, Vss is, for example, 0 V. In this operation from time T3 to time T4 in the next period, the plate line $PL_2$ and the word line $WL_2$ selected in the page erase operation go high from a first voltage $V_{PLL}$ to a second voltage $V_{PLH}$ and from a third voltage Vss to a fourth voltage $V_{WLH}$, thereby preventing the inversion layer 12a on the inner circumference of the first gate conductor layer 5a connected with the plate line $PL_2$ and the inversion layer 12b on the inner circumference of the second gate conductor layer 5b connected with the word line $WL_2$ from being formed, respectively, in the channel region 7. Therefore, if the threshold voltages of the second N-channel MOS transistor region on the side of the word line $WL_2$ and the first N-channel MOS transistor region on the side of the plate line $PL_2$ are $V_{tWL}$ and $V_{tPL}$, respectively, preferably the voltages $V_{BLH}$ and $V_{SLH}$ satisfy $V_{BLH} > V_{WLH} + V_{tWL}$ and $V_{SLH} > V_{pPL} + V_{tPL}$, respectively. For example, if $V_{tWL}$ and $V_{tPL}$ are 0.5 V, $V_{WLH}$ and $V_{PLH}$ can be set to 3 V and $V_{BLH}$ and $V_{SLH}$ can be set to 3.5 V or above.

Description of the page erase operation mechanism in FIG. 4BA will be continued. From time T3 to time T4 in the first period, as the plate line $PL_2$ and the word line $WL_2$ go high to the second voltage $V_{PLH}$ and the fourth voltage $V_{WLH}$, the voltage of the channel region 7 in a floating state is pushed up by first capacitive coupling between the plate line $PL_2$ and the channel region 7 and second capacitive coupling between the word line $WL_2$ and the channel region 7. The voltage of the channel region 7 goes high from $V_{FB}$ "1" in a 1-written state. This is because the voltages of the bit lines $BL_1$ to $BL_3$ and source line SL are high, namely, $V_{BLH}$ and $V_{SLH}$, making the pn junction between the N$^+$ layer 3a and the channel region 7 and the pn junction between the drain N$^+$ layer 3b and the channel region 7 reverse-biased, which enables boosting.

Description of the page erase operation mechanism in FIG. 4BA will be continued. From time T5 to time T6 in the next period, the voltages of the bit lines $BL_1$ to $BL_3$ and source line SL drop to Vss from high voltages of $V_{BLH}$ and $V_{SLH}$ As a result, the pn junction between the N$^+$ layer 3a and the channel region 7 and the pn junction between the drain N$^+$ layer 3b and the channel region 7 become forward-biased as shown in FIG. 4BC and positive hole groups remaining from the positive hole groups 9 of the channel region 7 are discharged to the source N$^+$ layer 3a and the drain N$^+$ layer 3b. Consequently, the voltage $V_{FB}$ of the channel region 7 becomes the built-in voltage Vb of the pn junction formed by the source N$^+$ layer 3a and the channel region 7 in a p-layer and the pn junction formed by the drain N$^+$ layer 3b and the channel region 7 in the p-layer.

Description of the page erase operation mechanism in FIG. 4BA will be continued. Next, from time T7 to time T8, the voltages of the bit lines $BL_1$ to $BL_3$ and source line SL go high to $V_{BLH}$ and $V_{SLH}$ from Vss. With this measure, as shown in FIG. 4BD, in lowering the plate line $PL_2$ and the word line $WL_2$ from the second voltage $V_{PLH}$ and the fourth voltage $V_{WLH}$ to the first voltage $V_{PLL}$ and the third voltage Vss, respectively, from time T9 to time T10, the voltage $V_{FB}$ of the channel region 7 is changed effectively from Vb to $V_{FB}$ "0" by the first capacitive coupling between the plate line PL$_2$ and the channel region 7 and the second capacitive coupling between the word line WL$_2$ and the channel region 7 without forming the inversion layer 12a on the side of the plate line PL$_2$ and the inversion layer 12b on the side of the word line WL$_2$ in the channel region 7. Thus, a voltage difference $\Delta V_{FB}$ of the channel region 7 between the 1-written state and the 0-erased state is given by the following equations.

$$V_{FB}\text{``}1\text{''}=Vb-\beta_{WL}\times Vt_{WL}\text{``}1\text{''}-\beta_{BL}\times V_{BLH} \quad (7)$$

$$V_{FB}\text{``}0\text{''}=Vb-\beta_{WL}\times V_{WLH}-\beta_{PL}\times(V_{PLH}-V_{PLL}) \quad (8)$$

$$\Delta V_{FB}=V_{FB}\text{``}1\text{''}-V_{FB}\text{``}0\text{''}=\beta_{WL}\times V_{WLH}+\beta_{PL}\times(V_{PLH}-V_{PLL})-\beta_{WL}\times Vt_{WL}\text{``}1\text{''}-\beta_{BL}\times V_{BLH} \quad (9),$$

where the sum of $\beta_{WL}$ and $\beta_{PL}$ is 0.8 or above, making $\Delta V_{FB}$ large enough to provide a sufficient margin.

Figure 4C:
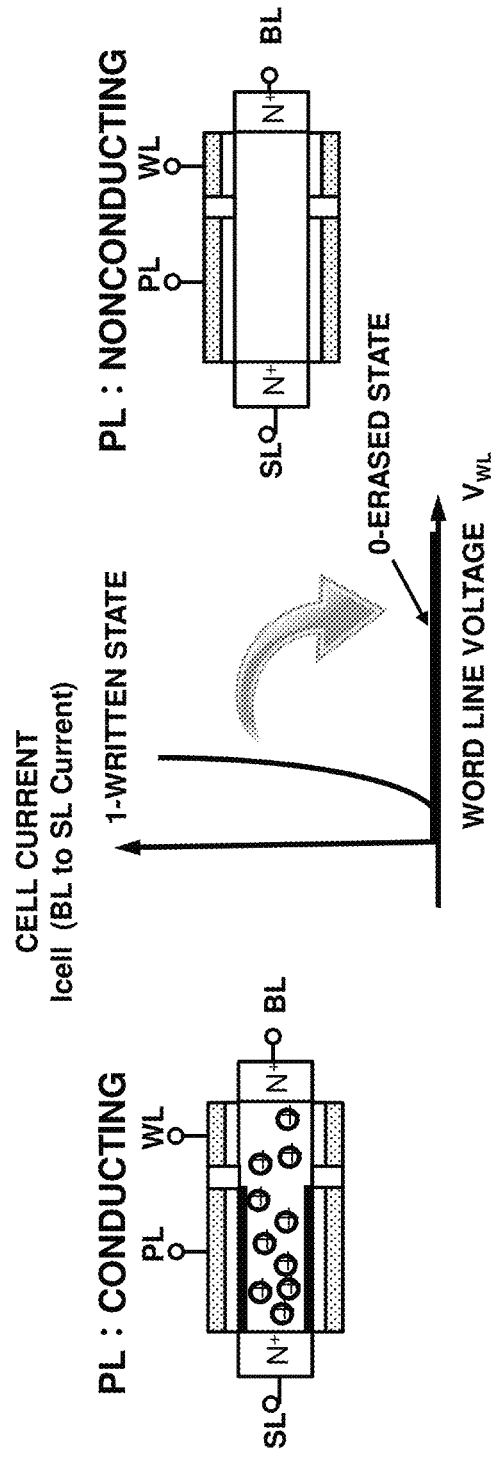
FIG. 4C is a diagram for explaining the page erase operation mechanism of the memory device having the SGT according to the first embodiment.

Consequently, as shown in FIG. 4C, a large margin can be provided between the 1-written state and the 0-erased state. Here, in the 0-erased state, the threshold voltage on the side of the plate line PL$_2$ is high due to the substrate bias effect. Therefore, if an applied voltage of the plate line PL$_2$ is set, for example, equal to or lower than the threshold voltage, the first N-channel MOS transistor region on the side of the plate line PL$_2$ becomes nonconducting and does not pass a memory cell current. "PL: Nonconducting" on the right side of FIG. 4C shows this situation.

Description of the page erase operation mechanism in FIG. 4BA will be continued. Next, from time T11 to time T12 in the fourth period, the voltages of the bit lines BL$_1$ to BL$_3$ and source line SL fall to Vss from $V_{BLH}$ and $V_{SLH}$, respectively, ending the erase operation. In so doing, the bit lines BL$_1$ to BL$_3$ and the source line SL lower the voltage of the channel region 7 slightly due to capacitive coupling, but this is equivalent to the amount of the voltage of the channel region 7 raised by the bit lines BL$_1$ to BL$_3$ and the source line SL due to capacitive coupling from time T7 to time T8, and thus the raising and lowering of the voltages of the bit lines BL$_1$ to BL$_3$ and source line SL are canceled out and consequently the voltage of the channel region 7 is not affected. The voltage $V_{FB}$ "0" of the channel region 7 in the 0-erased state is set to a second data retention voltage (which is an example of a "second data retention voltage" described in Claims). A page erase operation is performed and this state is assigned to logical storage data "0."

Next, a mechanism of the page erase operation will be described using FIGS. 4DA to 4DD. FIGS. 4DA to 4DD differ from FIGS. 4BA to 4BD in that during the page erase operation the bit lines BL$_1$ to BL$_3$ are set to Vss or kept in a floating state and that the word line WL$_2$ is fixed at Vss. Consequently, from time T1 to time T2, even if the source line SL rises from Vss to $V_{SLH}$, the second N-channel MOS transistor region of the word line WL$_2$ remains nonconducting and no memory cell current flows. Thus, there is no generation of positive hole groups 9 due to the impact ionization phenomenon. Besides, as with FIGS. 4BA to 4BD, the source line SL swings between Vss and $V_{SLH}$ while the plate line PL$_2$ swings between $V_{PLL}$ and $V_{PLH}$. Consequently, as shown in FIG. 4DC, the positive hole groups 9 are discharged to the N$^+$ layer 3a of the source line SL.

Next, the mechanism of the page erase operation will be described using FIGS. 4EA to 4ED. FIGS. 4EA to 4ED differ from FIGS. 4BA to 4BD in that during the page erase operation the source line SL is set to Vss or kept in a floating state and that the plate line PL$_2$ is fixed at Vss. Consequently, from time T1 to time T2, even if the bit lines BL$_1$ to BL$_3$ rise from Vss to $V_{BLH}$, the first N-channel MOS transistor region of the plate line PL$_2$ remains nonconducting and no memory cell current flows. Thus, there is no generation of positive hole groups 9 due to the impact ionization phenomenon. Besides, as with FIGS. 4BA to 4BD, the bit lines BL$_1$ to BL$_3$ swing between Vss and $V_{BLH}$ and the word line WL$_2$ swings between Vss and $V_{WLH}$. Consequently, as shown in FIG. 4EC, the positive hole groups 9 are discharged to the N$^+$ layers 3b of the bit lines BL$_1$ to BL$_3$.

Note that conditions of the voltages applied to the bit lines BL, the source lines SL, the word lines WL, and the plate lines PL as well as the potential of the floating body are exemplary in performing a page erase operation, and other conditions that allow a page erase operation to be performed may be used.

Figure 5A:
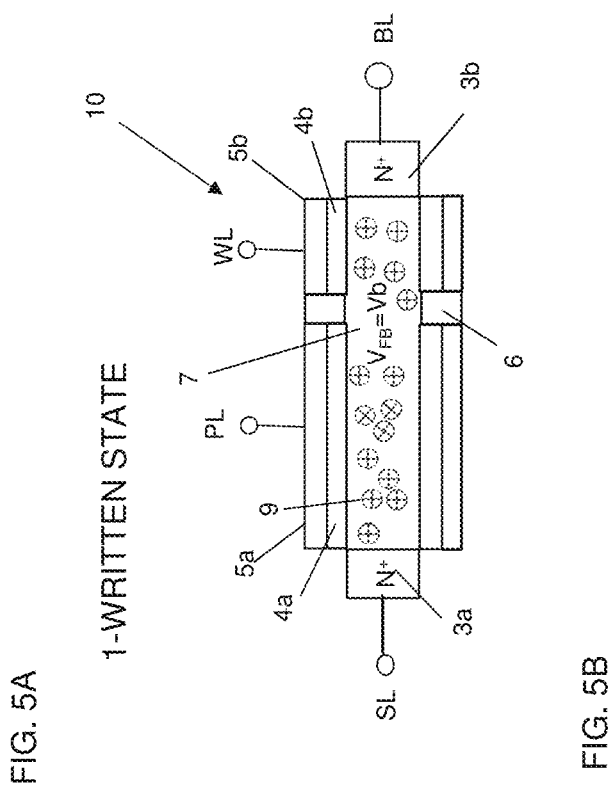
FIGS. 5A to 5C are diagrams for explaining a read operation mechanism of the memory device having the SGT according to the first embodiment.
Figure 5B:
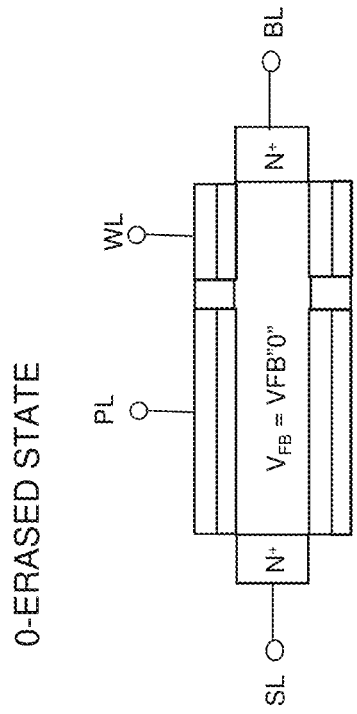
Figure 5C:
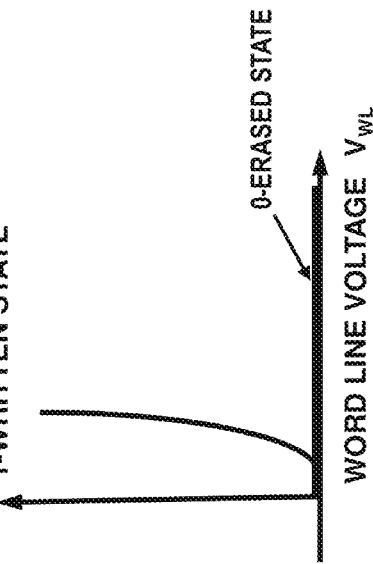

FIGS. 5A to 5C are diagrams for explaining a read operation of the dynamic flash memory cell according to the first embodiment of the present invention. As shown in FIG. 5A, when the channel region 7 is charged to the built-in voltage Vb (approximately 0.7 V), the threshold voltage of the second N-channel MOS transistor region having the second gate conductor layer 5b that is connected with the word line WL drops due to the substrate bias effect. This state is assigned to logical storage data "1." As shown in FIG. 5B, a memory block selected before a write is set to an erased state "0" in advance and the voltage $V_{FB}$ of the channel region 7 is $V_{FB}$ "0." As a result of write operations, a written state "1" is stored randomly. As a result, logical storage data of logic "0" and logic "1" is created for the word line WL. As shown in FIG. 5C, using a height difference between two threshold voltages for the word line WL, reading is done by a sense amplifier.

Note that conditions of the voltages applied to the bit lines BL, the source lines SL, the word lines WL, and the plate lines PL as well as the potential of the floating body are exemplary in performing read operations, and other conditions that allow read operations to be performed may be used.

Using FIGS. 6A to 6E, description will be given of how a page read operation (which is an example of a "page read operation" described in Claims) is performed during a refresh operation (which is an example of a "refresh operation" described in Claims) of the dynamic flash memory cell according to the first embodiment of the present invention.

Figure 6A:
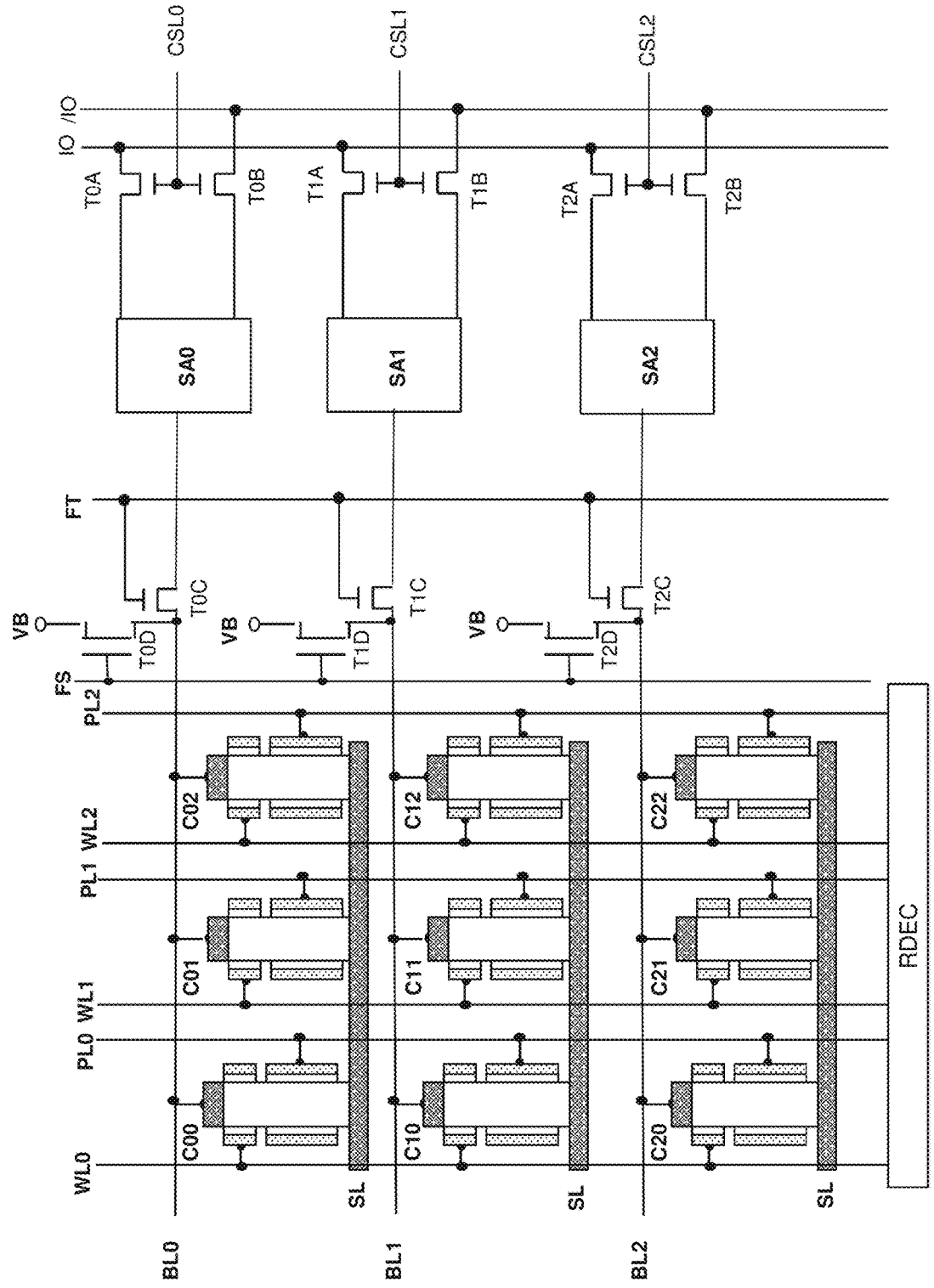
FIG. 6A is a circuit block diagram for explaining a refresh operation of the memory device having the SGT according to the first embodiment.

In FIG. 6A, three rows by three columns of memory cells C00 to C22 make up part of a memory cell block (which is an example of a "memory cell block" described in Claims). Whereas three rows by three columns of memory cells C00 to C22 are shown here, in an actual memory cell block, memory cells make up a matrix larger than a 3-row by 3-column matrix. The memory cells are connected with respective word lines WL0 to WL2, plate lines PL0 to PL2, source lines SL, and bit lines BL0 to BL2. Transistors T0C to T2C to whose gates transfer signals FT are input make up a switch circuit (which is an example of a "switch circuit" described in Claims). Also, drains of transistors T0D to T2D whose gates are connected to a bit line precharge signal FS are connected to bit line power supplies VB and sources are connected to the respective bit lines BL0 to BL2. Then, the bit lines BL0 to BL2 are connected to respective sense amplifier circuits SA0 to SA2 (which are an example of a "sense amplifier circuit" described in Claims) via switch circuits. The word lines WL0 to WL$_2$ and the plate lines PL0 to PL$_2$ are connected to a row decoder circuit (which is an example of a "row decoder circuit" described in Claims) RDEC. The sense amplifier circuits SA0 to SA2 are connected to a pair of input-output lines IO and /IO complementary to each other via transistors T0A and T2B whose gates are connected to column selection lines CSL0 to CSL2.

Figure 6B:
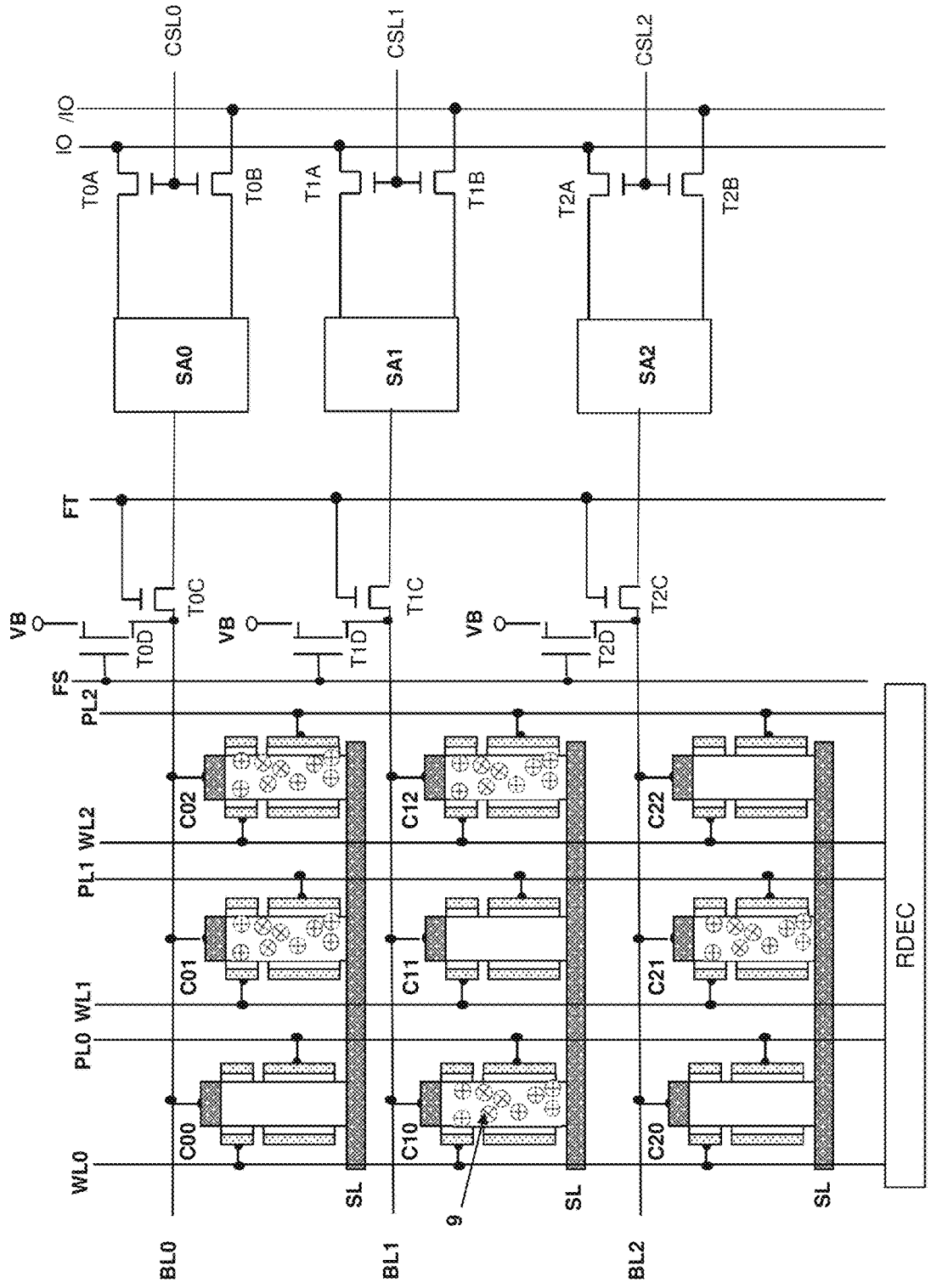
FIG. 6B is a circuit block diagram for explaining the refresh operation of the memory device having the SGT according to the first embodiment.

FIG. 6B shows how "1" is written into memory cells C10, C01, C21, C02, and C12 randomly out of the memory cells C00 to C22 with arbitrary timing, and positive hole groups 9 are accumulated in the channel semiconductor layers 7 of the memory cells.

Figure 6C:
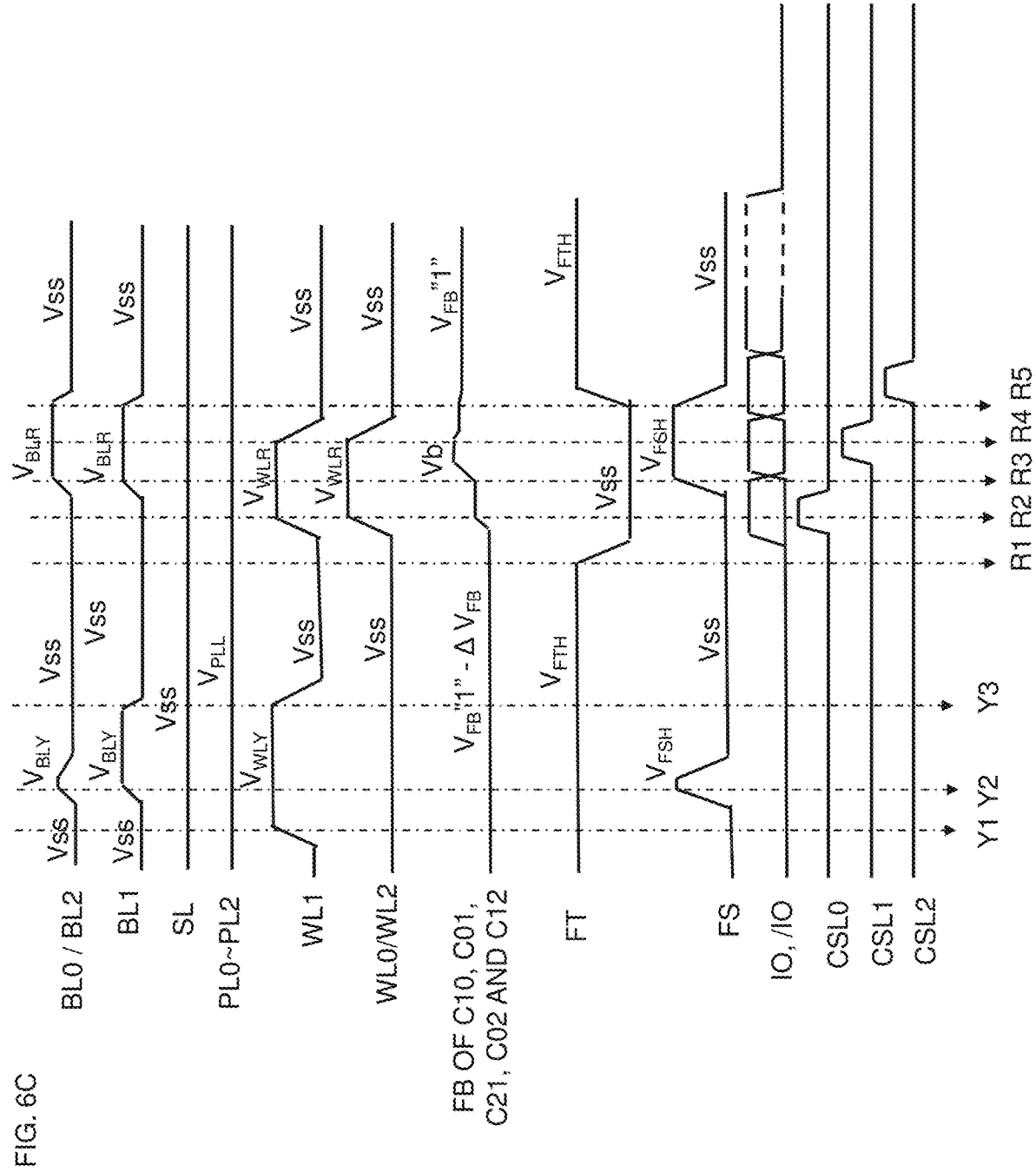
FIG. 6C is a circuit block diagram for explaining the refresh operation of the memory device having the SGT according to the first embodiment.

From time Y1 to time Y3 shown in FIG. 6C, page data stored in a first group of memory cells (which is an example of a "first memory cell group" described in Claims) C01, C11, and C21 belonging to a first page (which is an example of a "first page" described in Claims) is read into the sense amplifier circuits SA0 to SA2. At time Y1, the word line WL1 connected to the first group of memory cells C01, C11, and C21 rises from the low voltage Vss to a high voltage $V_{WLY}$ for reading and at time Y2, the bit lines BL0 to BL2 rise from the low voltage Vss to a high voltage $V_{BLY}$ for reading. Here, Vss may be, for example, ground voltage Vss=0 V. Then, at time Y3, the word line WL1 falls from the high voltage $V_{WLY}$ for reading to the low voltage Vss.

Figure 6D:
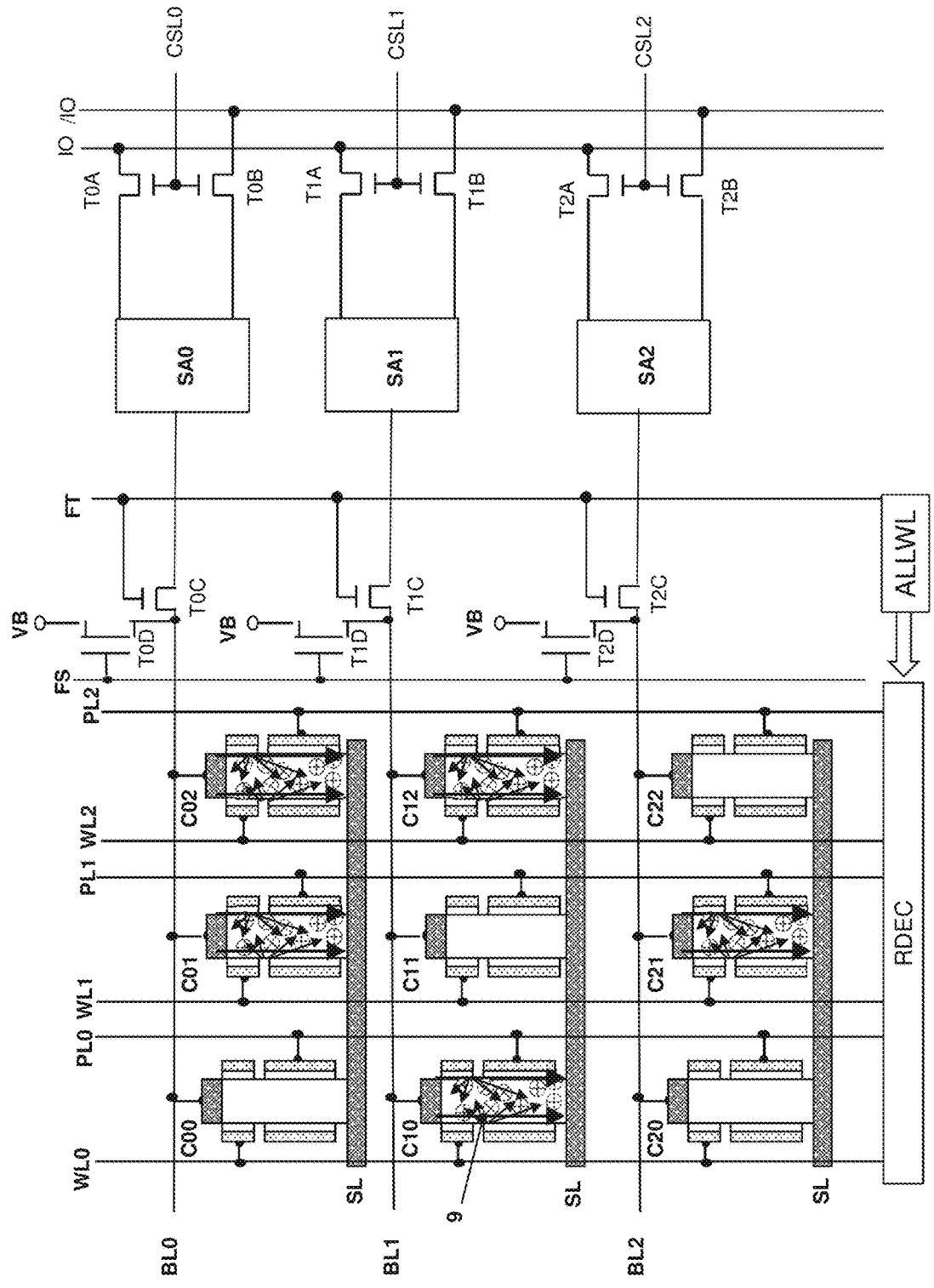
FIG. 6D is an operation waveform diagram for explaining the refresh operation of the memory device having the SGT according to the first embodiment.

The refresh operation will be described using FIGS. 6C and 6D. FIG. 6D shows a case in which a select-all-word-lines signal (which is an example of a "select-all-word-lines signal" described in Claims) ALLWL is input to the row decoder circuit. Here, it is shown how all the word lines WL0 to WL2 in the memory cell block are selected and the memory cells C10, C01, C21, C02, and C12 are subjected to a refresh operation. The refresh operation is performed to form positive hole groups 9 by the impact ionization phenomenon in the channel semiconductor layers 7 of the memory cells C10, C01, C21, C02, and C12 written with "1" in FIG. 6D. The threshold voltages of the respective first gate conductor layer 5a and second gate conductor layer 5b of the memory cells C10, C01, C21, C02, and C12 drop as much as 1 V, for example, from 1.3 V in the 0-erased state to 0.3 V in the 1-written state. Therefore, if voltages lower than the voltage for a "1" writing operation is input to the plate lines PL0 to PL2 and the word lines WL0 to WL2, a refresh operation can be performed to form positive hole groups 9 by the impact ionization phenomenon in the channel semiconductor layers 7 of the memory cells C10, C01, C21, C02, and C12. However, in FIG. 6C, it is assumed that the voltage of the channel semiconductor layers 7 of the memory cells C10, C01, C21, C02, and C12 written with "1" has dropped slightly from the first data retention voltage $V_{FB}$ "1" to $V_{FB}$ "1"$-\Delta V_{FB}$.

At time R1 in FIG. 6C, the transfer signal FT drops from a high voltage $V_{FTH}$ to the low voltage Vss. At time R2, all the word lines WL0 to WL2 are selected and the voltage rises from the low voltage Vss to the high voltage $V_{WLR}$ for refreshing. Here, for example, the low voltage Vss may be 0 V and the high voltage $V_{WLR}$ may be 1.3 V. Then, at time R3, when the bit line precharge signal FS rises from the low voltage Vss to a high voltage $V_{FSH}$, the bit lines BL0 to BL2 rise from the low voltage Vss to a high voltage $V_{BLR}$ for refreshing. As a result, even if the number of positive hole groups 9 has been reduced in the channel semiconductor layers 7 of the memory cells C10, C01, C21, C02, and C12 written with "1," the refresh operation raises the positive hole groups 9 to a built-in voltage Vb. Subsequently, when all the word lines WL0 to WL2 are reset at time R4 and the bit lines BL0 to BL2 are reset at time R5, as a result of capacitive coupling among the word lines WL0 to WL2, the bit lines BL0 to BL2, and the channel semiconductor layers 7, the voltage of the channel semiconductor layers 7 drops slightly from Vb to become the first data retention voltage $V_{FB}$ "1."

A circuit block shown in FIGS. 6A, 6B, and 6D allows the page data read from the first group of memory cells C01, C11, and C21 into the sense amplifier circuits SA0 to SA2 to be output to the input-output lines IO and /IO complementary to each other during page reading in the page refresh operation of a memory device having the dynamic flash memory cells according to the first embodiment of the present invention. Details will be described below.

When the word line WL1 is selected at time Y1 and the bit line precharge signal FS rises from Vss to the high voltage $V_{FSH}$ at time Y2, the data stored in the memory cells C01, C11, and C21 shown in FIG. 6C are read to the bit lines BL0 to BL2, respectively. During the page read operation, the transfer signal FT is $V_{FTH}$, the transistors T0C to T2C, which are switch circuits are in a conducting state, and the data stored in the memory cells C01, C11, and C21 are read into the sense amplifier circuits SA0 to SA2, in which logical decisions between "0" and "1" are made. Subsequently, when the refresh operation starts, the transfer signal FT drops from $V_{FTH}$ to Vss and the transistors T0C to T2C, which are switch circuits, enter a nonconducting state. Consequently, the bit lines BL0 to BL2 and the sense amplifier circuits SA0 to SA2 are electrically disconnected. The sense amplifier circuits SA0 to SA2 store page data read from the memory cells C01, C11, and C21. Next, the column selection lines CSL0 to CSL2 are input in sequence to the gates of the transistors T0A to T2B, and consequently the page data stored in the sense amplifier circuits SA0 to SA2 is output to the input-output lines IO and /IO complementary to each other.

The operation of writing page data into the sense amplifier circuits SA0 to SA2 during the refresh operation can also be explained using FIG. 6C. When the refresh operation starts, the transfer signal FT drops from $V_{FTH}$ to Vss and the transistors T0C to T2C, which are switch circuits, enter a nonconducting state. Consequently, the bit lines BL0 to BL2 and the sense amplifier circuits SA0 to SA2 are electrically disconnected. Here, the page data may be written into the sense amplifier circuits SA0 to SA2 from the input-output lines IO and /IO via the column selection lines CSL0 to CSL2. After the end of the refresh operation, a page erase operation is performed with respect to the first page into which the page data is to be written, the switch circuits are placed in a conducting state, and a page write operation is performed to write the page data of the sense amplifier circuits into the first memory cell group.

By electrically disconnecting the bit lines and the sense amplifier circuits using the switch circuits T0C to T2C in this way, it is possible to freely read page data stored in the sense amplifier circuits or write page data into the sense amplifier circuits during a refresh operation. Therefore, the refresh operation can be run as a background operation in the background of a page read operation or a page write operation. This makes it possible to provide a memory device corresponding to a high-speed system.

Figure 6E:
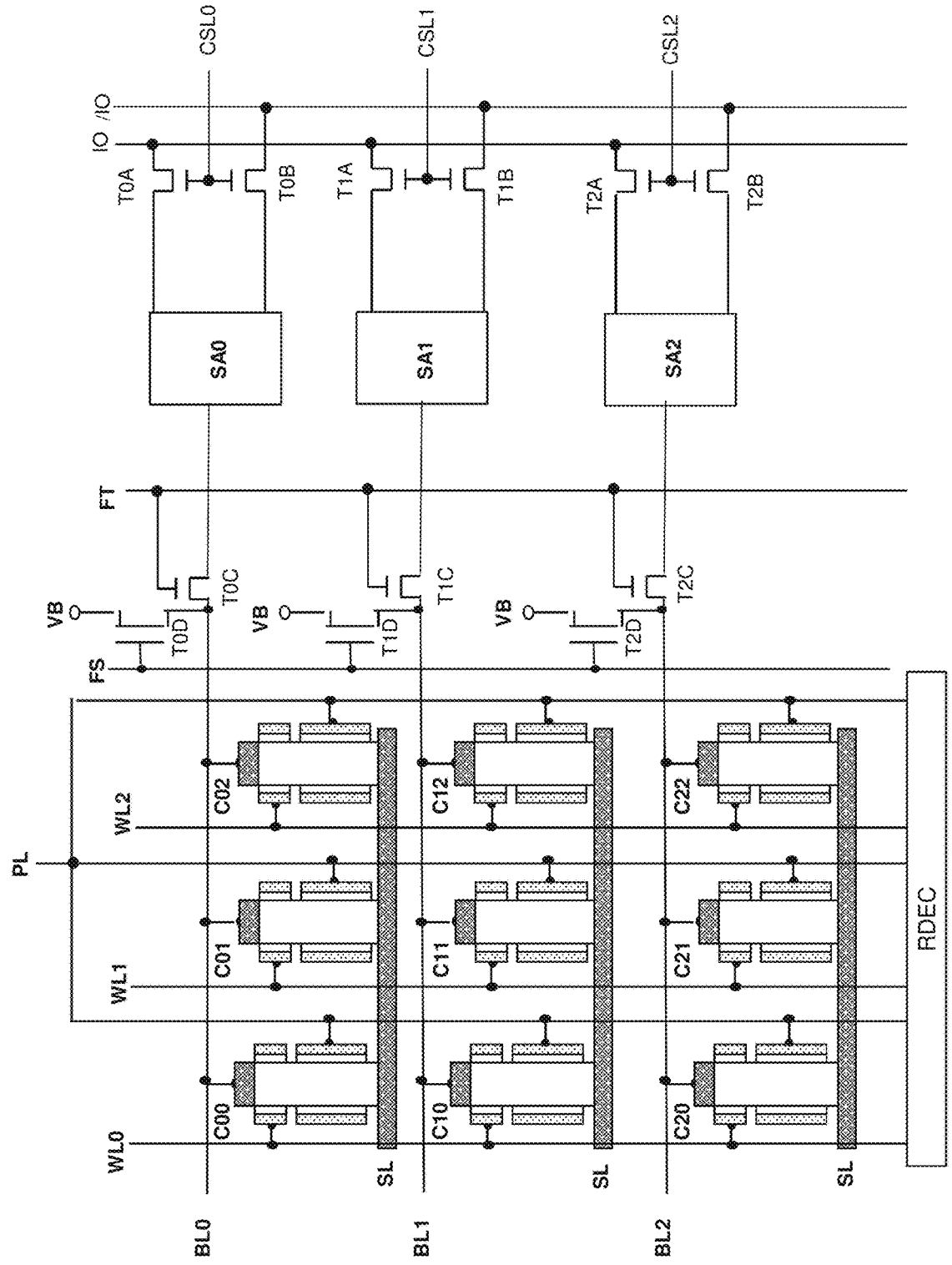
FIG. 6E is a circuit block diagram for explaining the refresh operation of the memory device having the SGT according to the first embodiment.
Figure 7B:
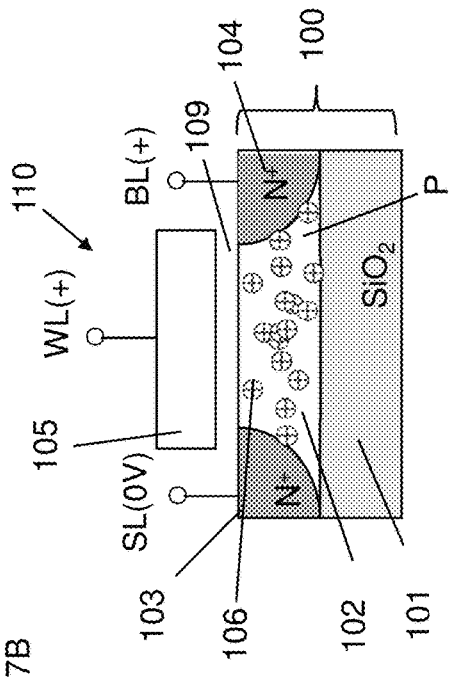
FIGS. 7A to 7D are diagrams for explaining a write operation of a capacitorless DRAM memory cell according to a conventional example.
Figure 7A:
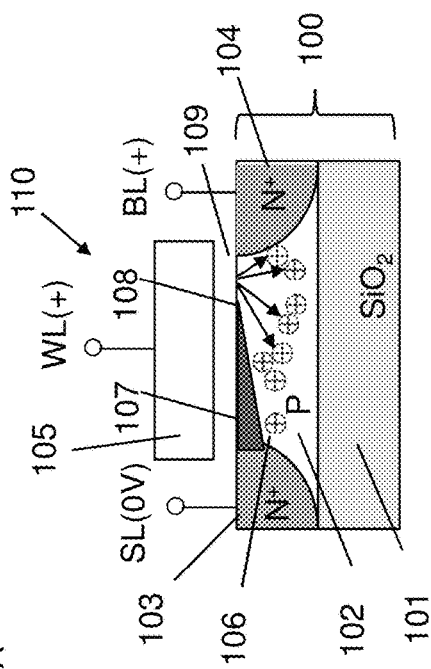
Figure 7C:
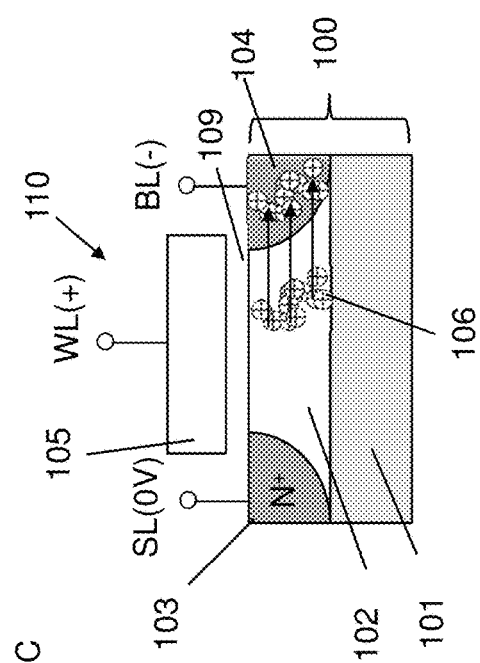
Figure 7D:
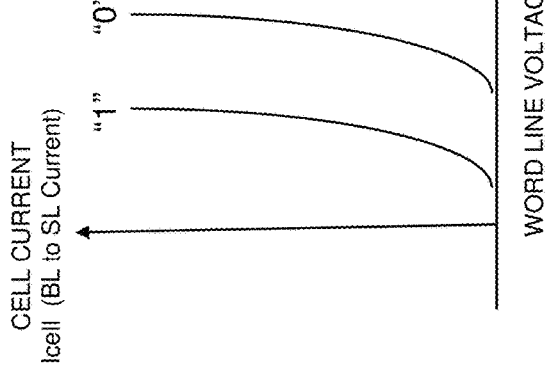
Figure 8A:
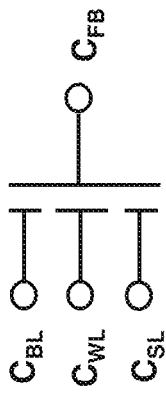
FIGS. 8A and 8B are diagrams for explaining problems in operations of a capacitorless DRAM memory cell according to a conventional example.
Figure 8B:
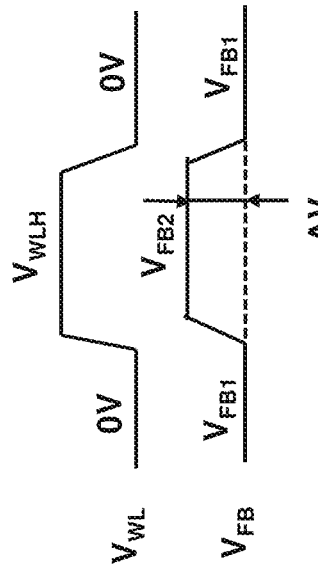

FIG. 6E shows an example in which a plate line PL is shared by adjacent memory cells in a 3-row by 3-column block of memory cells C00 to C22. Of operation waveforms in FIG. 6C, since PL0 to PL2 have a same input waveform, this configuration can also realize the refresh operation of the dynamic flash memory cell according to the first embodiment of the present invention.

In FIG. 1, operation of the dynamic flash memory described in the present embodiment can be performed even if a horizontal sectional shape of the Si pillar 2 is circular, elliptical, or rectangular. Besides, circular, elliptical, and rectangular dynamic flash memory cells may be allowed to coexist on a same chip.

In FIG. 1, a dynamic flash memory element has been described by taking as an example an SGT that includes the first gate insulating layer 4a surrounding an entire lateral surface of the Si pillar 2 erected in a vertical direction on a substrate, the second gate insulating layer 4b, and the first gate conductor layer 5a and second gate conductor layer 5b surrounding the entire first gate insulating layer 4a and second gate insulating layer 4b. As indicated in the description of the present embodiment, it is sufficient if the present dynamic flash memory element is structured to satisfy the condition that the positive hole groups 9 generated by the impact ionization phenomenon are held in the channel region 7. For that, it is sufficient that the channel region 7 has a floating body structure separated from the substrate 1. Consequently, the above-mentioned operation of the dynamic flash memory can be performed using, for example, GAA (Gate All Around; see, for example, Non Patent Literature 10) technology or Nanosheet technology (see, for example, Non Patent Literature 11), which are one of SGT even if the semiconductor base material of the channel region is formed horizontally to the substrate 1. A device structure (see, for example, Non Patent Literatures 7 to 10) that uses SOI (Silicon On Insulator) may also be used. In this device structure, a bottom of a channel region is in contact with an insulating layer of an SOI substrate and surrounds other channel regions while being surrounded by a gate insulating layer and an element separating insulating layer. In this structure, again the channel region has a floating body structure. In this way, it is sufficient if the dynamic flash memory element provided by the present embodiment satisfies the condition that the channel region has a floating body structure. Even with a structure in which a Fin transistor (see, for example, Non Patent Literature 13) is formed on an SOI substrate, the present dynamic flash operation can be performed as long as the channel region has a floating body structure.

Equations (1) to (12) in the present specification and drawings are used to quantitatively describe phenomena, and are not intended to limit the phenomena.

Note that whereas in the description of FIGS. 3AA to 3AC and 3B, a reset voltage of the word line WL, the bit line BL, and the source line SL is indicated as being Vss, different reset voltages may be used for the different lines.

Besides, an example of conditions for the page erase operation has been shown in FIG. 4A and in the description of FIG. 4A. In contrast, if a situation in which the positive hole groups 9 in the channel region 7 are removed from both or one of the N⁺ layer 3a and N⁺ layer 3b can be realized, the voltages applied to the source line SL, the plate line PL, the bit line BL, and the word line WL may be changed. Also, in the page erase operation, the bit line BL may be placed in a floating state by applying a voltage to the source line SL of a selected page. Also, in the page erase operation, the source line SL may be placed in a floating state by applying a voltage to the bit line BL of a selected page.

Besides, in a vertical direction in FIG. 1, in that part of the channel region 7 which is surrounded by the insulating layer 6, which is the first insulating layer, potential distributions of a first channel region 7a and a second channel region 7b are formed by being joined together. Consequently, the first channel region 7a and the second channel region 7b of the channel region 7 are joined together in the vertical direction via a region surrounded by the insulating layer 6, which is the first insulating layer.

Note that in FIG. 1, desirably vertical length of the first gate conductor layer 5a connected with the plate line PL is made still larger than vertical length of the second gate conductor layer 5b connected with the word line WL such that $C_{PL} > C_{WL}$. However, by merely adding the plate line PL, a capacitive coupling ratio ($C_{WL}/(C_{PL}+C_{WL}+C_{BL}+C_{SL})$) of the word line WL to the channel region 7 is reduced. This reduces a potential fluctuation $\Delta V_{FB}$ in the channel region 7 of the floating body.

Whereas in an operation waveform diagram of FIG. 6C, voltages of the bit line BL, the word line WL, and the plate line PL are expressly indicated in a concrete manner, it is sufficient if voltage conditions are such that the impact ionization phenomenon can be caused in the channel region 7 using a memory cell current to perform a refresh operation and thereby form positive hole groups 9.

Besides, a fixed voltage of, for example, approximately 1 V may be applied as the voltage $V_{PLL}$ of the plate line PL.

Note that in the present specification and the claims, the expression "a gate insulating layer, a gate conductor layer, or the like covers a channel or the like," the meanings of the term "covers" include surrounding an entire object such as in the case of an SGT or GAA, surrounding an object by leaving part of the object such as in the case of a Fin transistor, and furthermore lying over a planar object such as in the case of a planar transistor.

In FIG. 1, the first gate conductor layer 5a surrounds the entire first gate insulating layer 4a. In contrast, the first gate conductor layer 5a may be structured to surround part of the first gate insulating layer 4a in planar view. The first gate conductor layer 5a may be divided into at least two gate conductor layers and operated as electrodes of plate lines PL. Similarly, the second gate conductor layer 5b may be divided into two or more parts, each of which may be operated synchronously or asynchronously as a conductor electrode of a word line. This enables dynamic flash memory operation.

Whereas a refresh operation of a 1-bit dynamic flash memory cell made up of one piece of semiconductor base material has been described in FIGS. 6A to 6E, the present invention is also effective with respect to a refresh operation of a 1-bit high-speed dynamic flash memory cell made up of two pieces of semiconductor base material configured to store complementary data of "1" and "0."

Whereas a refresh operation of a memory array formed of a single layer of a 1-bit dynamic flash memory cell made up of one piece of semiconductor base material has been described in FIGS. 6A to 6E, the present invention is also effective with respect to a multi-layer memory array formed by stacking multiple tiers of 1-bit dynamic flash memory cells each made up of one piece of semiconductor base material.

The present embodiment provides the following features.

(Feature 1)

In the dynamic flash memory cell according to the present embodiment, the N⁺ layers 3a and 3b, which are to become the source and the drain, the channel region 7, the first gate insulating layer 4a, the second gate insulating layer 4b, the first gate conductor layer 5a, and the second gate conductor layer 5b are formed into the shape of a pillar as a whole. Then, the N⁺ layer 3a to become the source is connected to the source line SL, the N⁺ layer 3b to become the drain is connected to the bit line BL, the first gate conductor layer 5a is connected to the plate line PL, and the second gate conductor layer 5b is connected to the word line WL. The gate capacitance of the first gate conductor layer 5a connected with the plate line PL is structured to be higher than the gate capacitance of the second gate conductor layer 5b connected with the word line WL. In the present dynamic flash memory cell, the first gate conductor layer and the second gate conductor layer are stacked in the vertical direction. Consequently, even if the gate capacitance of the first gate conductor layer 5a connected with the plate line PL is structured to be higher than the gate capacitance of the second gate conductor layer 5b connected with the word line WL, the area of the memory cell is not increased in planar view. This makes it possible to achieve higher performance and greater packaging density of the dynamic flash memory cell at the same time.

(Feature 2)

The refresh operation of the dynamic flash memory cell according to the first embodiment of the present invention can return the positive hole groups 9 lost by leakage current and the like to a 1-written state again in the channel semiconductor layers 7 of the memory cell using the impact ionization phenomenon. The refresh operation can be performed simultaneously on the memory cells in a 1-written state selected by plural word lines WL or the word lines in an entire memory subarray and thereby reduce a total refresh time. This makes it possible to greatly improve the ratio of refresh time (duty ratio). Besides, it is possible to prevent write data of "1" from turning into "0" and thereby provide a highly reliable memory device.

(Feature 3)

By electrically disconnecting the bit lines and the sense amplifier circuits using the switch circuits T0C to T2C of the dynamic flash memory cell according to the first embodiment of the present invention it is possible to freely read page data stored in the sense amplifier circuits or write page data into the sense amplifier circuits during a refresh operation. Therefore, the refresh operation can be run as a background operation in the background of a page read operation or a page write operation. This makes it possible to provide a memory device corresponding to a high-speed system.

(Feature 4)

Taking a look at the role of the first gate conductor layer 5a connected with the plate line PL of the dynamic flash memory cell according to the first embodiment of the present invention, when the dynamic flash memory cell performs write and read operations, the voltage of the word line WL swings up and down. In so doing, the plate line PL serves the role of reducing the capacitive coupling ratio between the word line WL and the channel region 7. This makes it possible to greatly reduce the effect of voltage variations of the channel region 7 when the voltage of the word line WL swings up and down. This in turn makes it possible to increase a difference in the threshold voltage of an SGT transistor of the word line WL, the difference representing logic "0" or logic "1." This leads to an increase in an operating margin of the dynamic flash memory cell.

Other Embodiments

Note that whereas a Si pillar is formed in the present invention, a semiconductor pillar made of a semiconductor material other than Si may be used. This similarly applies to other embodiments of the present invention.

Besides, in writing "1," using a gate induced drain leakage (GIDL) current described in Non Patent Literatures 10 and 11, electron-hole pairs may be generated by the impact ionization phenomenon and the floating body FB may be filled with generated positive hole groups. This similarly applies to other embodiments of the present invention.

Also, in FIG. 1, in a structure in which polarity of conductivity type of each of the $N^+$ layers 3a and 3b and p-layer Si pillar 2 is reversed, the dynamic flash memory operation is performed. In this case, in the Si pillar 2, which is N-type, majority carriers become electrons. Thus, electron groups generated by impact ionization are accumulated in the channel region 7, and a "1" state is established.

The memory block may be formed by arranging the Si pillars of the memory cell in a two-dimensional form, a tetragonal lattice form, or an orthorhombic lattice form. When the Si pillars are placed in an orthorhombic lattice form, Si pillars may be arranged in a zigzag form or saw-like form by placing plural Si pillars joined to one word line on each side. This similarly applies to other embodiments.

The present invention can be embodied or modified in various forms without departing from the spirit and scope of the present invention in a broad sense. Also, the embodiments described above are meant to be illustrative, and not to limit the scope of the present invention. The embodiments and variations described above can be combined as desired. Furthermore, even if some components of the embodiments described above are removed as required, the resulting inventions fall within the scope of the technical idea of the present invention.

INDUSTRIAL APPLICABILITY

The memory device that uses a semiconductor element according to the present invention provides a dynamic flash memory, which is a memory device that uses a high-performance SGT with great packaging density.

The invention claimed is:

1. A memory device that uses a semiconductor element, in which a page is made up of a plurality of memory cells arranged in a row direction of a substrate, and a plurality of the pages is arranged in a column direction,
wherein each of the memory cells contained in each of the pages includes:
a semiconductor base material erected on the substrate in a vertical direction of the substrate or extended on the substrate in a horizontal direction,
a first impurity layer and a second impurity layer provided on opposite ends of the semiconductor base material,
a first gate insulating layer placed in contact with, or close to, the first impurity layer, partially or entirely surrounding a lateral surface of the semiconductor base material between the first impurity layer and the second impurity layer,
a second gate insulating layer joined to the first gate insulating layer and placed in contact with, or close to, the second impurity layer, surrounding the lateral surface of the semiconductor base material,
a first gate conductor layer covering part or all of the first gate insulating layer,
a second gate conductor layer covering the second gate insulating layer, and
a channel semiconductor layer in which the semiconductor base material is covered with the first gate insulating layer and the second gate insulating layer;
a positive hole group generated by an impact ionization phenomenon is held in the channel semiconductor layer by controlling voltages applied to the first gate conductor layer, the second gate conductor layer, the first impurity layer, and the second impurity layer;

during a page write operation, a voltage of the channel semiconductor layer is set to a first data retention voltage higher than a voltage/voltages of one or both of the first impurity layer and the second impurity layer;

during a page erase operation, by controlling voltages applied to the first impurity layer, the second impurity layer, the first gate conductor layer, and the second gate conductor layer, the positive hole group is pulled out from one or both of the first impurity layer and the second impurity layer, and the voltage of the channel semiconductor layer is set to a second data retention voltage lower than the first data retention voltage;

the first impurity layer of the memory cell is connected with a source line, the second impurity layer is connected with a bit line, one of the first gate conductor layer and the second gate conductor layer is connected with a word line, and another is connected with a drive control line;

the bit line is connected to a sense amplifier circuit via a switch circuit;

at least one of the word lines is selected and a refresh operation is performed to return the voltage of the channel semiconductor layer of the selected word line to the first data retention voltage by controlling voltages applied to the selected word line, the drive control line, the source line, and the bit line and thereby forming the positive hole group by an impact ionization phenomenon in the channel semiconductor layer of the memory cell in which the voltage of the channel semiconductor layer is set to the first data retention voltage using the page write operation; and concurrently with the refresh operation, a page read operation is performed to read page data of a first memory cell group belonging to a first page into the sense amplifier circuit by placing the switch circuit in a nonconducting state.

2. The memory device that uses a semiconductor element according to claim 1, wherein during the refresh operation, a select-all-word-lines signal is input to the row decoder circuit to select all the word lines in the memory cell block.

3. The memory device that uses a semiconductor element according to claim 1, wherein the drive control line of the memory cells arranged in the row direction and in the column direction is disposed in common to adjacent ones of the memory cells.

4. The memory device that uses a semiconductor element according to claim 1, wherein the memory device performs:

an operation of writing the page data into the sense amplifier circuit during the refresh operation with the switch circuit kept in a nonconducting state;

the page erase operation with respect to the first page after an end of the refresh operation; and the page write operation to write the page data of the sense amplifier circuit into the first memory cell group with the switch circuit kept in a conducting state.

5. The memory device that uses a semiconductor element according to claim 1, wherein first gate capacitance between the first gate conductor layer and the channel semiconductor layer is higher than second gate capacitance between the second gate conductor layer and the channel semiconductor layer.

6. The memory device that uses a semiconductor element according to claim 1, wherein when viewed in an axial direction of the semiconductor base material, the first gate conductor layer is separated into at least two conductor layers by surrounding the first gate insulating layer.

* * * * *

UNITED STATES PATENT AND TRADEMARK OFFICE
CERTIFICATE OF CORRECTION

PATENT NO. : 11,990,204 B2
APPLICATION NO. : 17/857317
DATED : May 21, 2024
INVENTOR(S) : Koji Sakui and Nozomu Harada It is certified that error appears in the above-identified patent and that said Letters Patent is hereby corrected as shown below:

In the Claims
Column 21, Claim 1, Line 23, delete "the"

Signed and Sealed this
Twenty-fifth Day of June, 2024

Katherine Kelly Vidal
*Director of the United States Patent and Trademark Office*